(12) United States Patent
Shigihara

(10) Patent No.: US 8,111,726 B2
(45) Date of Patent: Feb. 7, 2012

(54) SEMICONDUCTOR LASER DEVICE

(75) Inventor: Kimio Shigihara, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 435 days.

(21) Appl. No.: 12/535,779

(22) Filed: Aug. 5, 2009

(65) Prior Publication Data

US 2010/0103970 A1  Apr. 29, 2010

(30) Foreign Application Priority Data

Oct. 27, 2008  (JP) ................................. 2008-275846
Apr. 3, 2009  (JP) ................................. 2009-090934

(51) Int. Cl.
*H01S 5/00* (2006.01)
(52) U.S. Cl. ................................. 372/45.01; 372/45.012
(58) Field of Classification Search ................. 372/45.01
See application file for complete search history.

(56) References Cited

U.S. PATENT DOCUMENTS

| 6,175,582 B1 | 1/2001 | Naito et al. |
| 6,285,694 B1 | 9/2001 | Shigihara |
| 6,333,945 B1 | 12/2001 | Abe et al. |
| 2006/0007975 A1 | 1/2006 | Hirata et al. |

FOREIGN PATENT DOCUMENTS

| JP | 11-163458 A | 6/1999 |
| JP | 11-233882 A | 8/1999 |
| JP | 11-233883 A | 8/1999 |
| JP | 11-243259 A | 9/1999 |
| JP | 2006-32437 A | 2/2006 |

OTHER PUBLICATIONS

Sebastian, J. et al., "High-Power 810 nm GaAsP-AlGaAs Diode Lasers with Narrow Beam Divergence", IEEE Journal on Selected Topics in Quantum Electronics, 7(2):334-339, Mar./Apr. 2001.

*Primary Examiner* — Armando Rodriguez
(74) *Attorney, Agent, or Firm* — Leydig, Voit & Mayer, Ltd.

(57) ABSTRACT

A semiconductor laser device includes: an n-type cladding layer, a p-type cladding layer, an active layer located between the n-type cladding layer and the p-type cladding layer, an n-side guiding layer located on the same side of the active layer as the n-type cladding layer, and a p-side guiding layer located on the same side of the active layer as the p-type cladding layer. The n-side guiding layer, the active layer, and the p-side guiding layer are undoped or substantially undoped. The sum of the thicknesses of the n-side guiding layer, the active layer, and the p-side guiding layer is not less than 0.5 times the lasing wavelength of the semiconductor laser device and is not more than 2 μm. The p-side guiding layer is thinner and has a lower refractive index than the n-side guiding layer.

14 Claims, 29 Drawing Sheets

*Fig.* 7

SEMICONDUCTOR LASER DEVICE

BACKGROUND OF THE INVENTION

1. Field of the Invention

The present invention relates to a semiconductor laser device.

2. Background Art

Various types of semiconductor laser devices are conventionally known, including those for DVD writing or information processing, solid state lasers such as Nd-doped YAG (Nd:YAG) lasers and Yb-doped YAG (Yb:YAG) layers, pumping source lasers such as Yb-doped fiber lasers and Er-doped fiber amplifiers, and lasers for optical communications. J. Sebastian et al. disclose a semiconductor laser device including a structure in which a GaAsP active layer is sandwiched between $Al_xGa_{1-x}As$ optical guiding layers having the same thickness and composition. (See J. Sebastian et al., "High-Power 810-nm GaAsP-AlGaAs Diode Lasers With Narrow Beam Divergence," IEEE J. Select. Topics In Quantum Electron., vol. 7, No. 2, pp. 334-339, 2001.) This structure allows the semiconductor laser device to operate at high output power. Other prior art includes Japanese Laid Open Patent Publication Nos. 11-233882 (1999), 11-233883 (1999), 11-243259 (1999), 2006-32437, and 11-163458 (1999).

SUMMARY OF THE INVENTION

In recent years, there has been an increasing need for a semiconductor laser device having a high electrical-to-optical power conversion efficiency in order to reduce power consumption. However, we are already approaching the point where it is no longer possible to improve the slope efficiency of semiconductor laser devices by increasing the thickness of the guiding layers and thereby reducing light absorption. That is, prior art techniques do not seem to be adequate to further reduce the power consumption of semiconductor laser devices. The present inventors have earnestly conducted research in order to overcome this problem and have come up with a semiconductor laser device having a high electrical-to-optical power conversion efficiency.

The prevent invention has been made to solve the above problem. It is, therefore, an object of the present invention to provide a semiconductor laser device having a high electrical-to-optical power conversion efficiency.

According to a first aspect of the present invention, a semiconductor laser device includes: an n-type cladding layer, a p-type cladding layer, an active layer located between the n-type cladding layer and the p-type cladding layer, an n-side guiding layer located on the same side of the active layer as the n-type cladding layer, and a p-side guiding layer located on the same side of the active layer as the p-type cladding layer. The n-side guiding layer, the active layer, and the p-side guiding layer are undoped or substantially undoped. The sum of the thicknesses of the n-side guiding layer, the active layer, and the p-side guiding layer is not less than 0.5 times the lasing wavelength of the semiconductor laser device and is not more than 2 μm. The p-side guiding layer is thinner and has a lower refractive index than the n-side guiding layer.

According to a second aspect of the present invention, a semiconductor laser device includes: an n-type cladding layer; a p-type cladding layer; an active layer located between the n-type cladding layer and the p-type cladding layer; an n-side guiding layer located on the same side of the active layer as the n-type cladding layer; and a p-side guiding layer located on the same side of the active layer as the p-type cladding layer. The n-side guiding layer, the active layer, and the p-side guiding layer are undoped or substantially undoped. The sum of the thicknesses of the n-side guiding layer, the active layer, and the p-side guiding layer is not less than 0.5 times the lasing wavelength of the semiconductor laser device and is not more than 2 μm. The p-side guiding layer is thinner than the n-side guiding layer, and the p-type cladding layer has a lower refractive index than the n-type cladding layer.

According to a third aspect of the present invention, a semiconductor laser device includes: an n-type cladding layer, a p-type cladding layer, an active layer located between the n-type cladding layer and the p-type cladding layer, an n-side guiding layer located on the same side of the active layer as the n-type cladding layer, and a p-side guiding layer located on the same side of the active layer as the p-type cladding layer. The n-side guiding layer, the active layer, and the p-side guiding layer are undoped or substantially undoped. The sum of the thicknesses of the n-side guiding layer, the active layer, and the p-side guiding layer is not less than 0.5 times the lasing wavelength of the semiconductor laser device and is not more than 2 μm. The p-side guiding layer is thinner and has a lower refractive index than the n-side guiding layer. The p-type cladding layer has a lower refractive index than the n-type cladding layer.

Other and further objects, features and advantages of the invention will appear more fully from the following description.

According to a fourth aspect of the present invention, a semiconductor laser device includes: an n-type cladding layer; a p-type cladding layer; an active layer located between the n-type cladding layer and the p-type cladding layer; an n-side guiding layer located on the same side of the active layer as the n-type cladding layer; and a p-side guiding layer located on the same side of the active layer as the p-type cladding layer. The n-side guiding layer, the active layer, and the p-side guiding layer are undoped or substantially undoped. The sum of the thicknesses of the n-side guiding layer, the active layer, and the p-side guiding layer is not less than 0.5 times the lasing wavelength of the semiconductor laser device and is not more than 2 μm. The p-side guiding layer is thinner than the n-side guiding layer. The n-side guiding layer includes a first layer located on a side of the active layer, a second layer located on a side of the n-type cladding layer, and a third layer disposed between the first layer and the second layer. The third layer has a higher refractive index than the first layer and the second layer.

According to a fifth aspect of the present invention, a semiconductor laser device includes: an n-type cladding layer; a p-type cladding layer; an active layer located between the n-type cladding layer and the p-type cladding layer; an n-side guiding layer located on the same side of the active layer as the n-type cladding layer; and a p-side guiding layer located on the same side of the active layer as the p-type cladding layer. The n-side guiding layer, the active layer, and the p-side guiding layer are undoped or substantially undoped. The sum of the thicknesses of the n-side guiding layer, the active layer, and the p-side guiding layer is not less than 0.5 times the lasing wavelength of the semiconductor laser device and is not more than 2 μm. The p-side guiding layer is thinner than the n-side guiding layer. The p-type cladding layer has a lower refractive index than said n-type cladding layer. The n-side guiding layer includes a first layer located on a side of the active layer, a second layer located on a side of the n-type cladding layer, and a third layer disposed between the first layer and the second layer. The third layer has a higher refractive index than the first layer and the second layer.

DETAILED DESCRIPTION OF THE PREFERRED EMBODIMENTS

First Embodiment

Figure 1:
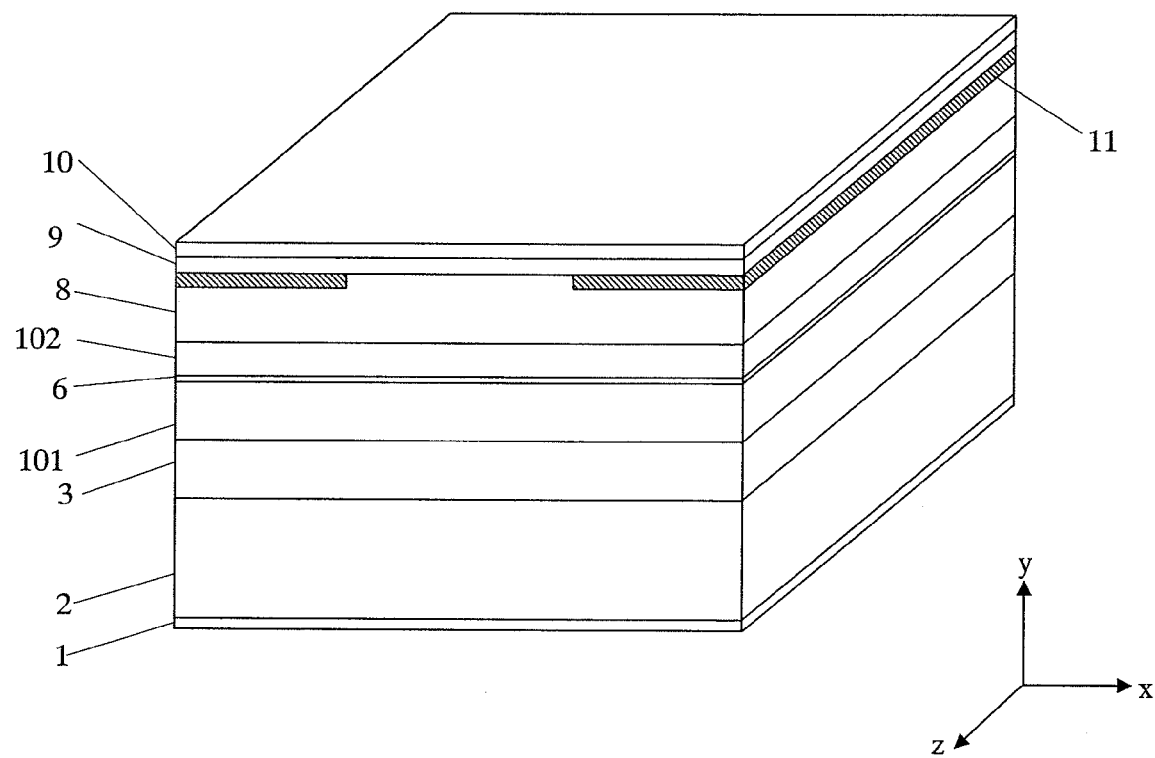
FIG. 1 is a perspective view of a semiconductor laser device used to illustrate features of a first embodiment of the present invention.

FIG. 1 is a perspective view of an 810 nm semiconductor laser device used to illustrate features of a first embodiment of the present invention. With reference to FIG. 1, the following describes the advantages obtained when the undoped region of the device, which includes the guiding and active layers, etc., has a thickness at least 0.5 times the oscillation or lasing wavelength.

The reference numerals and corresponding components in FIG. 1 are as follows: 1, an n-electrode; 2, an n-type GaAs substrate; 3, an n-type $Al_xGa_{1-x}As$ cladding layer with a thickness of 1.5 μm (where the Al mole fraction x=0.55); 101, an n-side $Al_yGa_{1-y}As$ outer guiding layer with a thickness of t/2 nm (where y=0.35); 6, an $Al_wGa_{1-w}As$ active layer with a thickness of 10 nm (where w=0.10); 102, a p-side $Al_sGa_{1-s}As$ guiding layer with a thickness of t/2 nm (where s=0.35); 8, a p-type $Al_tGa_{1-t}As$ cladding layer with a thickness of 1.5 μm (where t=0.55); 9, a p-type GaAs contact layer; 10, a p-electrode; and 11, proton implantation regions.

The n-side $Al_yGa_{1-y}As$ outer guiding layer 101 and the p-side $Al_sGa_{1-s}As$ guiding layer 102 are undoped or substantially undoped; no intentional doping is performed on these layers.

Figure 2:
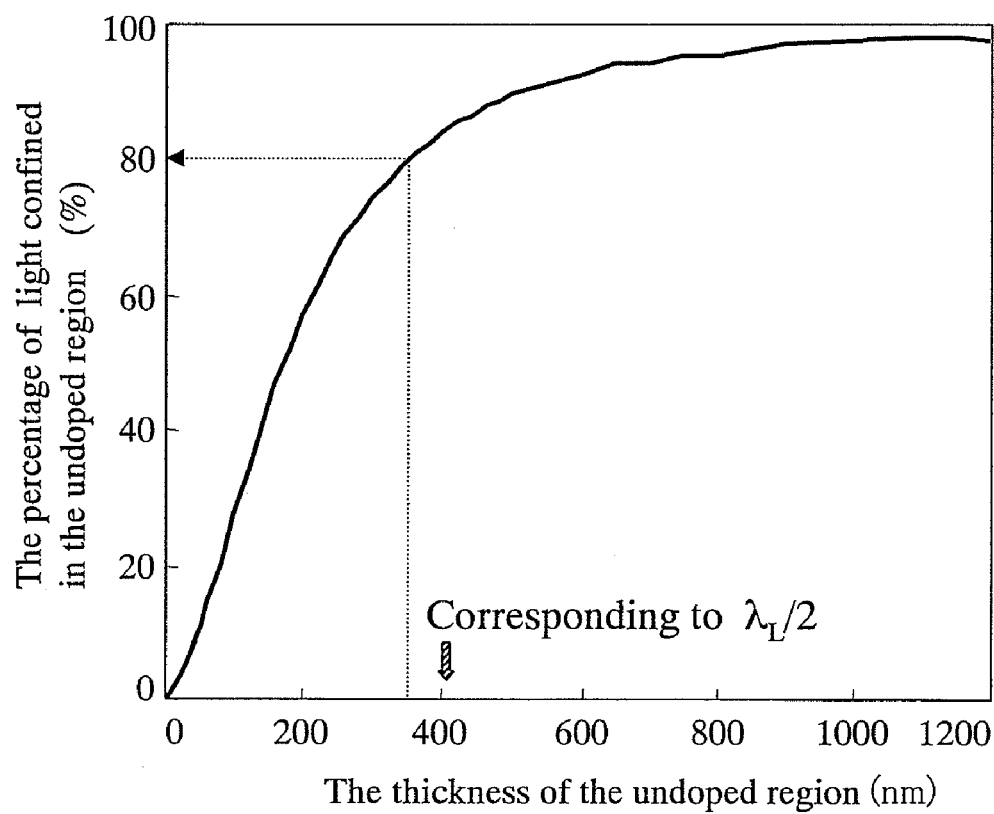
FIG. 2 shows the percentage of light confined to the undoped region of the semiconductor laser device as a function of the thickness of the undoped region.

FIG. 2 shows the percentage of light confined to the undoped region of the semiconductor laser device of FIG. 1 as a function of the thickness of the undoped region, wherein the thickness of the undoped region is changed by changing the thickness (t/2) of the n-side $Al_yGa_{1-y}As$ outer guiding layer 101 and the thickness (t/2) of the p-side $Al_sGa_{1-s}As$ guiding layer 102. When the undoped region has a small thickness of, e.g., 100 nm, the percentage of light confined in the undoped region is approximately 28%. The remaining 72% of the light is present in the p-type doped and n-type doped cladding layers, meaning that the loss in the semiconductor laser device depends substantially on the free carrier absorption in the cladding layers.

When the undoped region has a substantial thickness of at least 0.5 times the lasing wavelength of the semiconductor laser, on the other hand, 80% or more of the light is present in the undoped region. Therefore, the loss in the semiconductor laser depends substantially on the free carrier absorption in the undoped region.

The illustrations in FIGS. 1 and 2 are by way of example only. Any semiconductor laser device is constructed such that the guiding layers have a higher refractive index than the cladding layers in order to confine light to the guiding layers. Further, the degree of optical confinement is determined substantially solely by the normalized frequency, which in turn is determined by the difference in refractive index between the guiding layers and the cladding layers, the thickness of the undoped region, and the lasing wavelength. Therefore, if the undoped region has a thickness at least 0.5 times the lasing wavelength, then most of the light is confined to the undoped region.

According to the present embodiment, the undoped region is limited to a maximum thickness of 2-3 μm (corresponding to the electron and hole diffusion lengths).

Configuration of First Practical Example of First Embodiment

Figure 3:
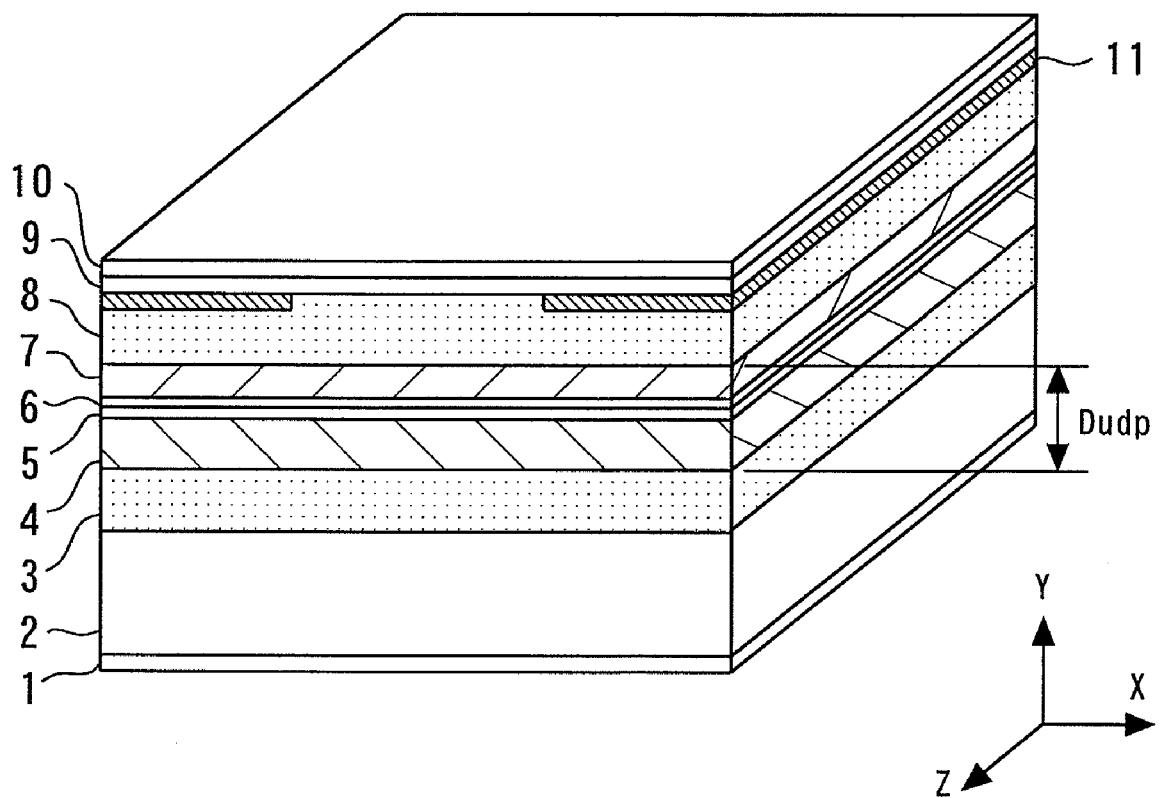
FIG. 3 is a perspective view of a semiconductor laser device according to a first practical example of the first embodiment of the present invention.

FIG. 3 is a perspective view of an 810 nm semiconductor laser device according to a first practical example of the first embodiment. Reference numerals and corresponding components in FIG. 3 are as follows: 4, an n-side $Al_yGa_{1-y}As$ outer guiding layer with a thickness of 650 nm (where y=0.35); 5, an n-side $Al_zGa_{1-z}As$ inner guiding layer with a thickness 50 nm (where z=0.30); and 7, a p-side $Al_sGa_{1-s}As$ guiding layer with a thickness 300 nm (where s=0.35).

The n-side $Al_yGa_{1-y}As$ outer guiding layer 4, the n-side $Al_zGa_{1-z}As$ inner guiding layer 5, and the p-side $Al_sGa_{1-s}As$ guiding layer 7 are undoped or substantially undoped; no intentional doping is performed on these layers. That is, these layers are not intentionally doped with impurities in the crystal growth process and in the wafer process, so that they are undoped or substantially undoped. Further, in this example, the undoped layers of the device, which include the guiding layers 4, 5, and 7 and the active layer, have a combined thickness Dudp of 1010 nm, which is approximately 1.24 times the lasing wavelength (see FIG. 3).

It should be noted that in the following description, a guiding layer located on the same side of the active layer as the p-type cladding layer is referred to simply as a "p-side guiding layer." In the present embodiment, the p-side $Al_sGa_{1-s}As$ guiding layer 7 is a p-side guiding layer. Likewise, a guiding layer located on the same side of the active layer as the n-type cladding layer is referred to simply as an "n-side guiding layer." In the present embodiment, the n-side $Al_yGa_{1-y}As$ outer guiding layer 4 and the n-side $Al_zGa_{1-z}As$ inner guiding layer 5 are n-side guiding layers.

Operation and Optical Intensity Distribution in First Practical Example

The semiconductor laser device is forward biased so that electrons are injected from the n-type $Al_xGa_{1-x}As$ cladding layer 3 into the $Al_wGa_{1-w}As$ active layer 6 through the n-side $Al_yGa_{1-y}As$ outer guiding layer 4 and the n-side $Al_zGa_{1-z}As$ inner guiding layer 5 and so that holes are injected from the p-type $Al_tGa_{1-t}As$ cladding layer 8 into the active layer 6 through the p-side $Al_sGa_{1-s}As$ guiding layer 7.

Figure 4:
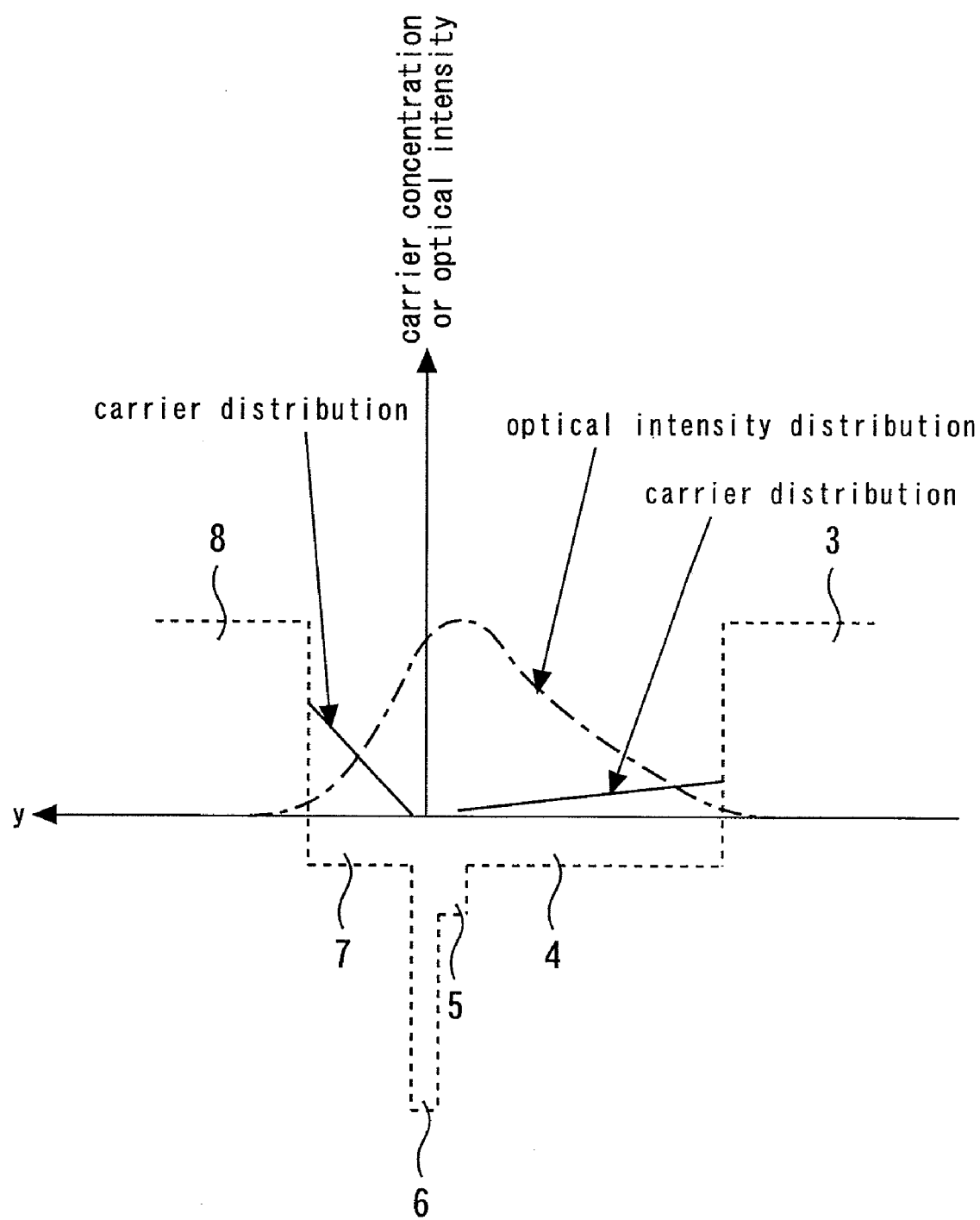
FIG. 4 shows near field intensity distribution and the carrier distributions according to a first practical example of the first embodiment of the present invention.

FIG. 4 schematically shows the near field pattern (NFP), or near field intensity distribution, which is determined by the carrier distributions (electron and hole distributions) and refractive index distributions in the n-side $Al_yGa_{1-y}As$ outer guiding layer 4, the n-side $Al_zGa_{1-z}As$ inner guiding layer 5, and the p-side $Al_sGa_{1-s}As$ guiding layer 7.

In FIG. 4, the broken line indicates the band structure of the conduction band, the thick solid lines indicate the carrier concentrations (electron and hole concentrations), and the chain line indicates the optical intensity distribution. At each point within the optical guiding layers the electron and hole densities are equal, since charge neutral conditions exist within these layers. In FIG. 4, the active layer extends along the x-axis (i.e., perpendicular to the y-axis), and its center is located at the origin of the coordinate system. The carrier density is minimized at the junction between the active layer and each adjacent guiding layer, and increases toward each cladding layer 3, 8. Let $\mu_n$ and $\mu_p$ denote the electron mobility and hole mobility, respectively. The slope of the carrier distribution curve within the p-side guiding layer is $\mu_n/\mu_p$ times the slope of the carrier distribution curve within the n-side guiding layers.

It should be noted that the optical intensity distribution is asymmetrical. Specifically, the peak of the optical intensity distribution is located on the same side of the active layer 6 as the n-side inner guiding layer 5, which has a high refractive index.

Figure 5:
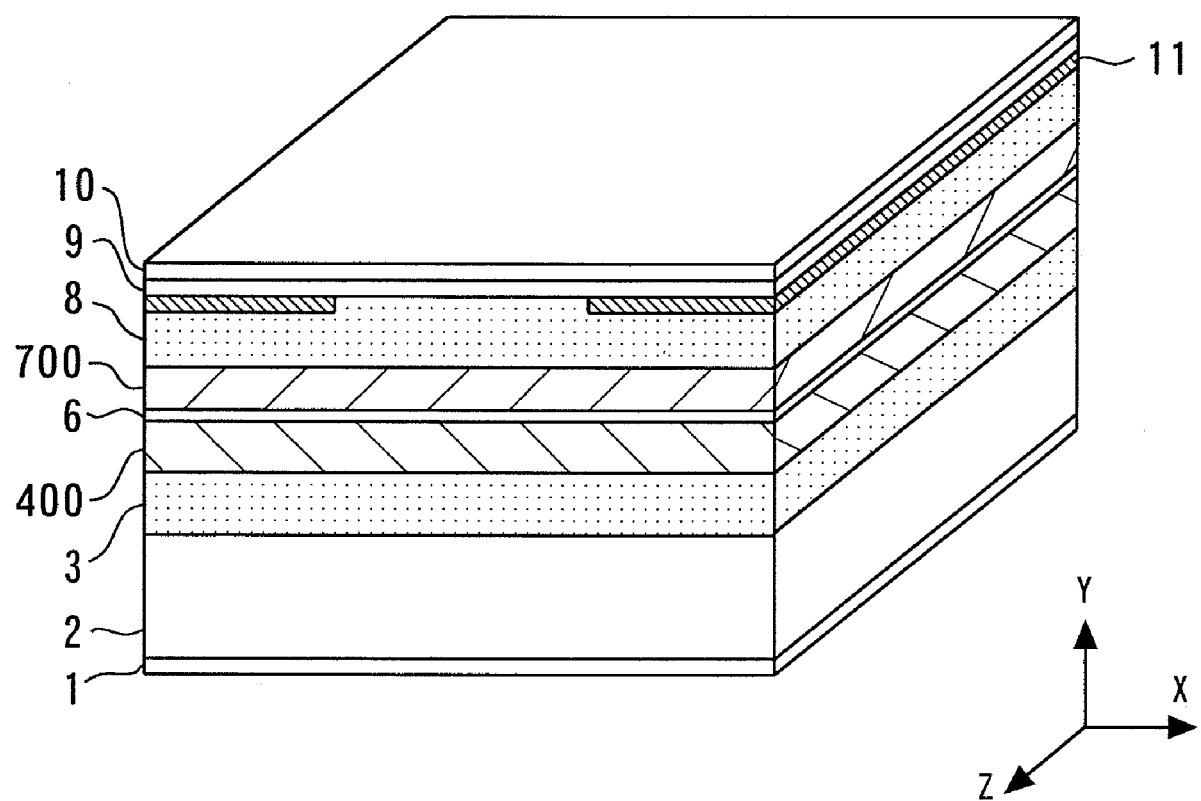
FIG. 5 shows a comparative semiconductor laser device.
Figure 6:
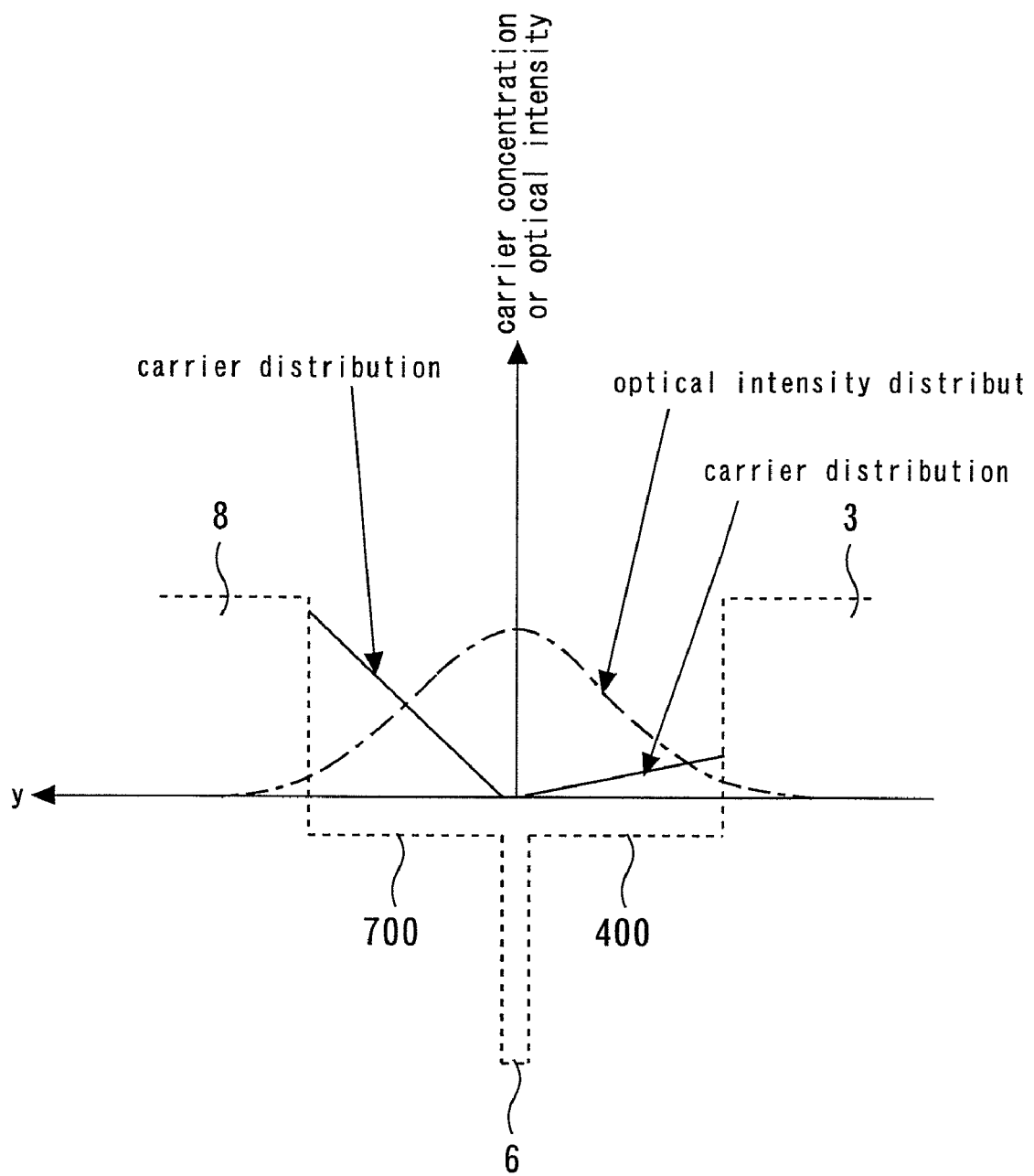
FIG. 6 schematically shows the carrier distribution and the optical intensity distribution according to the comparative semiconductor laser device.

Description of Advantages of First Embodiment by Way of Comparison with Comparative Example FIG. 5 shows a comparative semiconductor laser device having a symmetrical structure. In FIG. 5, reference numeral 400 denotes an n-side $Al_yGa_{1-y}As$ guiding layer with a thickness of 500 nm (where y=0.35) and reference numeral 700 denotes a p-side $Al_sGa_{1-s}As$ guiding layer with a thickness of 500 nm (where s=0.35). FIG. 6 schematically shows the carrier distribution and the optical intensity distribution.

As shown in FIG. 6, the carrier density is minimized at the junction between the active layer and each guiding layer, and gradually increases toward each cladding layer 3, 8, as in the first embodiment. However, in the comparative example, a large number of carriers are present in the p-type guiding layer, since the slope of the carrier distribution curve within the p-side guiding layer is $\mu_n/\mu_p$ times the slope of the carrier distribution curve within the n-side guiding layer. Further, the optical intensity distribution is symmetrical relative to the active layer.

In the present embodiment, on the other hand, the carrier density in the p-side guiding layer is significantly reduced as compared to the comparative example, since the thickness of the p-side guiding layer is reduced and the combined thickness of the n-side guiding layers is greater than the n-side guiding layer of the comparative example. This reduces the light absorption by carriers within the guiding layers, thereby increasing the slope efficiency.

Further, the combined refractive index of the two n-side guiding layers (i.e., the n-side $Al_yGa_{1-y}As$ outer guiding layer 4 and the n-side $Al_zGa_{1-z}As$ inner guiding layer 5) is higher than the refractive index of the p-side guiding layer. As a result, the optical intensity distribution in the device is such the optical intensity in and around the active layer is higher than when the combined refractive index of the n-side guiding layers is equal to the refractive index of the p-side guiding layer. This increases the optical confinement factor, i.e., the percentage of light confined to the active layer, allowing the semiconductor laser device to have a high electrical-to-optical power conversion efficiency without increase in the threshold current.

In the present embodiment, the p-side guiding layer, the active layer, and the n-side guiding layers are undoped or substantially undoped; no intentional doping is performed on these layers. Further, the sum of the thicknesses of the p-side guiding layer, the active layer, and the n-side guiding layers is at least 0.5 times the lasing wavelength. As a result, most of the laser light exists within these layers, and the free carrier absorption in the cladding layers is reduced.

These features enable the semiconductor laser device to have a high electrical-to-optical power conversion efficiency. Further, environmental advantages of the present embodiment include extended useful life (i.e., extended durability) and reduced energy consumption (energy saving).

Other Practical Examples of First Embodiment

Second Practical Example

Figure 7:
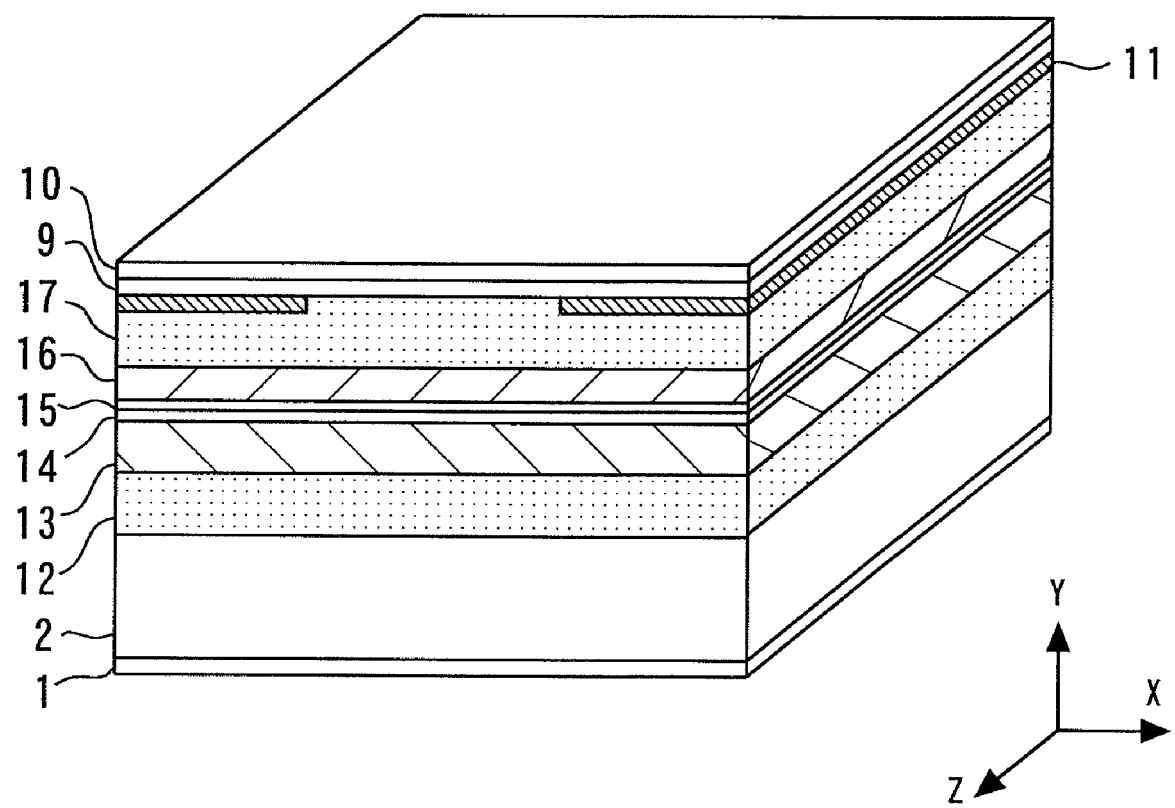
FIG. 7 is a perspective view of a semiconductor laser device according to a second practical example of the first embodiment of the present invention.

FIG. 7 is a perspective view of a 980 nm semiconductor laser device according to a second practical example of the present embodiment. Reference numerals and corresponding components in FIG. 7 are as follows: 12, an n-type $Al_xGa_{1-x}$As cladding layer with a thickness of 1.5 μm (where the Al mole fraction x=0.30); 13, an n-side $Al_yGa_{1-y}$As outer guiding layer with a thickness of 650 nm (where y=0.05); 14, an n-side GaAs inner guiding layer with a thickness of 50 nm; 15, an $In_xGa_{1-x}$As active layer with a thickness of 10 nm (where z=0.20); 16, a p-side $Al_sGa_{1-s}$As guiding layer with a thickness of 300 nm (where s=0.05); and 17, a p-type $Al_tGa_{1-t}$As cladding layer with a thickness of 1.5 μm (where t=0.30).

The n-side $Al_yGa_{1-y}$As outer guiding layer 13, the n-side GaAs inner guiding layer 14, and the p-side $Al_sGa_{1-s}$As guiding layer 16 are undoped or substantially undoped; no intentional doping is performed on these layers. In this example, the undoped layers of the device, which include the guiding layers 13, 14, and 16 and the active layer 15, have a combined thickness Dudp of 1010 nm, which is approximately 1.03 times the lasing wavelength (see FIG. 7).

Third Practical Example

Figure 8:
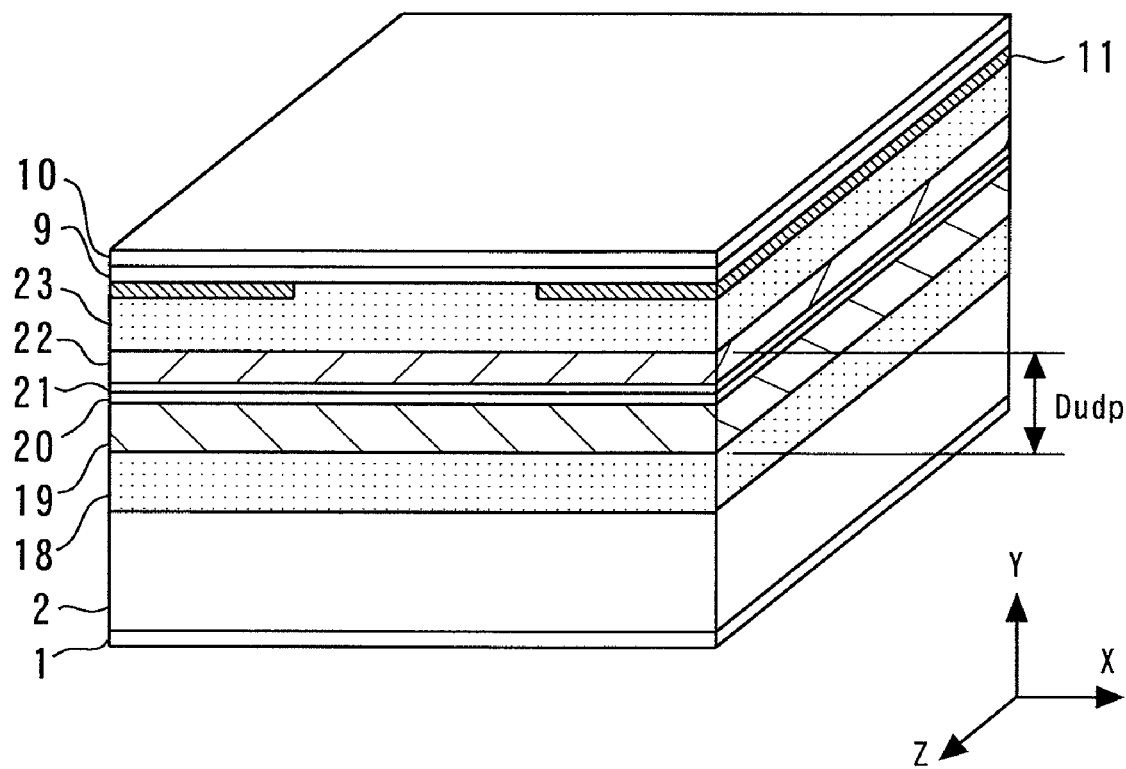
FIG. 8 is a perspective view of a semiconductor laser device according to a third practical example of the first embodiment of the present invention.

FIG. 8 is a perspective view of an 810 nm semiconductor laser device according to a third practical example of the present embodiment. Reference numerals and corresponding components in FIG. 8 are as follows: 18, an n-type $(Al_xGa_{1-x})_{0.51}In_{0.49}P$ cladding layer with a thickness of 1.5 μm (where the Al mole fraction x=0.50); 19, an n-side InGaP outer guiding layer with a thickness of 275 nm; 20, an n-side $In_{1-y}Ga_yAs_zP_{1-z}$ inner guiding layer with a thickness of 25 nm (where z=0.10 and y=0.56); 21, a $GaAs_{1-w}P_w$ active layer with a thickness of 10 nm (where w=0.12); 22, a p-side InGaP guiding layer with a thickness of 100 nm; and 23, a p-type $(Al_xGa_{1-x})_{0.51}In_{0.49}P$ cladding layer with a thickness of 1.5 μm (where x=0.50).

The n-side InGaP outer guiding layer 19, the n-side $In_{1-y}Ga_yAs_zP_{1-z}$ inner guiding layer 20, and the p-side InGaP guiding layer 22 are undoped or substantially undoped; no intentional doping is performed on these layers. In this example, the undoped layers of the device, which include the guiding layers 19, 20, and 22 and the active layer 21, have a combined thickness Dudp of 410 nm, which is approximately 0.51 times the lasing wavelength (see FIG. 8).

Further, the As mole fraction z and the Ga mole fraction y of the n-side InGaAsP inner guiding layer are such that this layer is lattice matched to GaAs.

Fourth Practical Example

Figure 9:
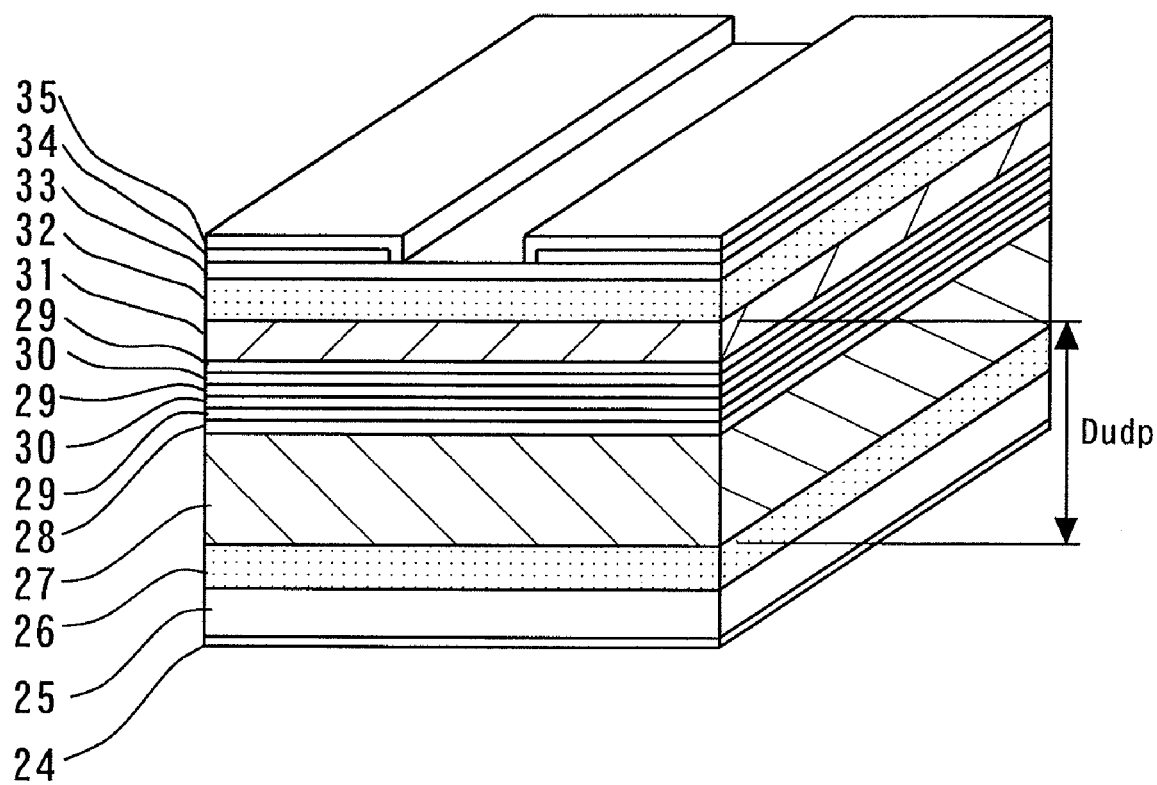
FIG. 9 is a perspective view of a semiconductor laser device according to a fourth practical example of the first embodiment of the present invention.

FIG. 9 is a perspective view of a 400 nm semiconductor laser device according to a fourth practical example of the present embodiment. The reference numerals and corresponding components in FIG. 9 are as follows: 24, an n-electrode; 25, an n-type GaN substrate; 26, an n-type $Al_xGa_{1-x}$N cladding layer with a thickness of 0.5 μm (where the Al mole fraction x=0.14); 27, an n-side GaN outer guiding layer with a thickness of 300 nm; 28, an n-side $In_yGa_{1-y}$N inner guiding layer with a thickness of 25 nm (where the In mole fraction y=0.05); 29, $In_zGa_{1-z}$N active layers with a thickness of 3.5 nm (where the In mole fraction z=0.15); 30, GaN barrier layers with a thickness of 7 nm; 31, a p-side GaN guiding layer with a thickness of 150 nm; 32, a p-type $Al_xGa_{1-x}$N cladding layer with a thickness of 0.5 μm (where the Al mole fraction x=0.14); 33, a p-type GaN contact layer; 34, SiN insulating films; and 35, p-electrodes.

Thus the semiconductor laser of this example has a triple quantum well structure including three $In_zGa_{1-z}$N active layers with a thickness of 3.5 nm (where the In mole fraction z=0.15) to lase at a wavelength of approximately 400 nm.

The n-side GaN outer guiding layer 27, the n-side $In_yGa_{1-y}$N inner guiding layer 28, the GaN barrier layers 30, and the p-side GaN guiding layer 31 are undoped or substantially undoped; no intentional doping is performed on these layers. In this example, the undoped layers of the device, which include the guiding layers 27, 28, and 31, the barrier layers 30, and the active layers 29, have a combined thickness Dudp of 499.5 nm, which is approximately 1.25 times the lasing wavelength (see FIG. 9).

Fifth Practical Example

Figure 10:
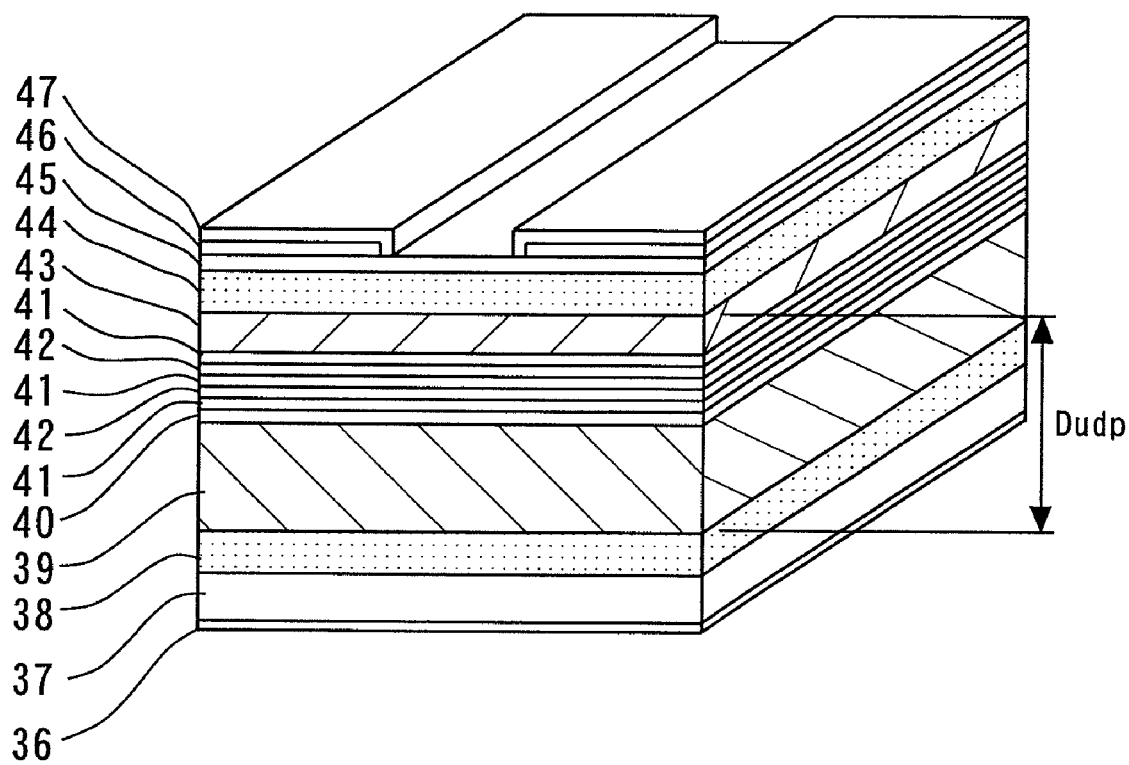
FIG. 10 is a cross-sectional perspective view of a semiconductor laser device according to a fifth practical example of the first embodiment of the present invention.

FIG. 10 is a cross-sectional perspective view of a 1310 nm semiconductor laser device according to a fifth practical example of the present embodiment. The reference numerals and corresponding components in FIG. 10 are as follows: 36, an n-electrode; 37, an n-type InP substrate; 38, an n-type $In_{1-x}Ga_xAs_yP_{1-y}$ cladding layer with a thickness of 500 nm (where the Ga mole fraction x=0.183 and the As mole fraction y=0.40); 39, an n-side $In_{1-z}Ga_zAs_wP_{1-w}$ outer guiding layer with a thickness of 600 nm (where the Ga mole fraction z=0.262 and the As mole fraction w=0.568); 40, an n-side $In_{1-s}Ga_sAs_tP_{1-t}$ inner guiding layer with a thickness of 50 nm (where the Ga mole fraction s=0.348 and the As mole fraction t=0.750); 41, $In_{1-u}Ga_uAs_vP_{1-v}$ active layers with a thickness of 7.5 nm (where the Ga mole fraction u=0.443 and the As mole fraction v=0.950); 42, $In_{1-q}Ga_qAs_rP_{1-r}$ barrier layers with a thickness of 23 nm (where the Ga mole fraction q=0.262 and the As mole fraction r=0.568); 43, a p-side $In_{1-z}Ga_zAs_wP_{1-w}$ guiding layer with a thickness of 300 nm (where the Ga mole fraction z=0.262 and the As mole fraction w=0.568); 44, a p-type $In_{1-x}Ga_xAs_yP_{1-y}$ cladding layer with a thickness of 500 nm (where the Ga mole fraction x=0.183 and the As mole fraction y=0.40); 45, a p-type InP contact layer; 46, $SiO_2$ insulating films; and 47, p-electrodes.

Thus the semiconductor laser of this example has a triple quantum well structure including three $In_{1-u}Ga_uAs_vP_{1-v}$ active layers with a thickness of 7.5 nm (where the Ga mole fraction u=0.443 and the As mole fraction v=0.950) to lase at a wavelength of about 1310 nm.

The n-side $In_{1-z}Ga_zAs_wP_{1-w}$ outer guiding layer 39, the n-side $In_{1-s}Ga_sAs_tP_{1-t}$ inner guiding layer 40, the $In_{1-q}Ga_qAs_rP_{1-r}$ barrier layers 42, and the p-side $In_{1-z}Ga_zAs_wP_{1-w}$ guiding layer 43 are undoped or substantially undoped; no intentional doping is performed on these layers. In this example, the undoped layers of the device, which include the guiding layers 39, 40, and 43, the barrier layers 42, and the active layers 41, have a combined thickness Dudp of 1018.5 nm, which is approximately 0.78 times the lasing wavelength (see FIG. 10).

Sixth Practical Example

Figure 11:
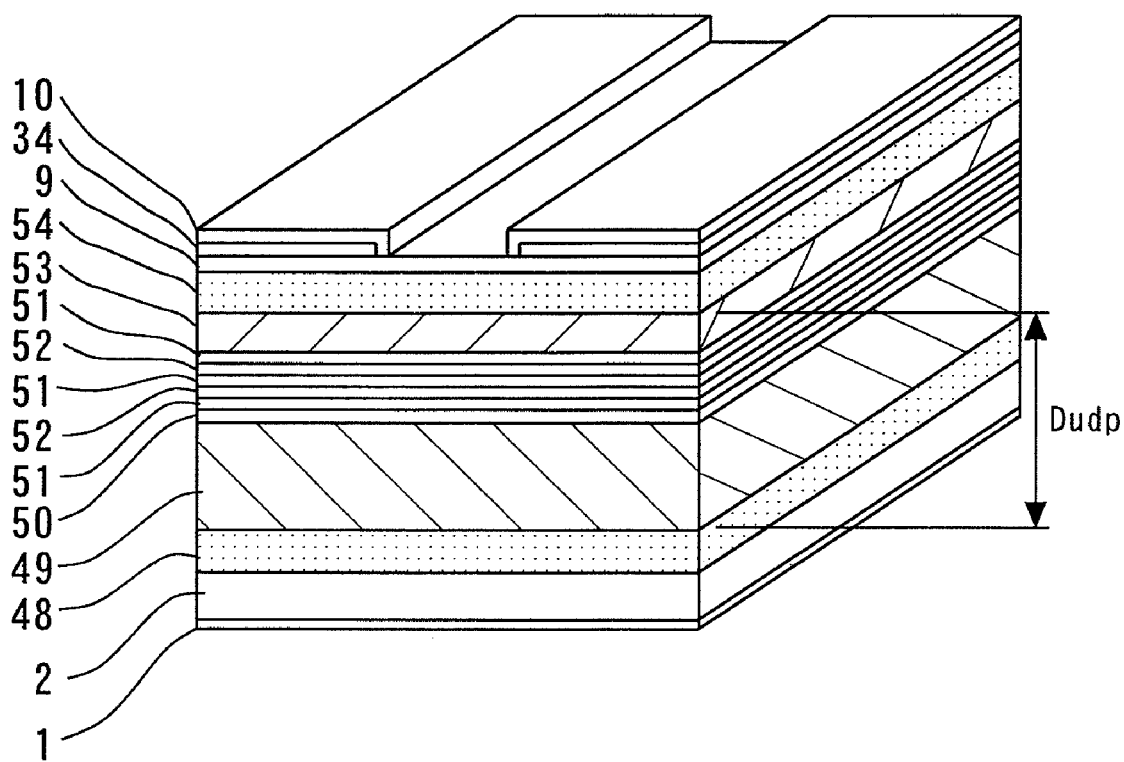
FIG. 11 is a perspective view of a semiconductor laser device according to a sixth practical example of the first embodiment of the present invention.

FIG. 11 is a perspective view of a 660 nm semiconductor laser device according to a sixth practical example of the present embodiment. Reference numerals and corresponding components in FIG. 11 are as follows: 48, an n-type $(Al_xGa_{1-x})_{0.51}In_{0.49}P$ cladding layer with a thickness of 1.5 μm (where the Al mole fraction x=0.70); 49, an n-side $(Al_yGa_{1-y})_{0.51}In_{0.49}P$ outer guiding layer with a thickness of 600 nm (where the Al mole fraction y=0.50); 50, an n-side $(Al_zGa_{1-z})_{0.51}In_{0.49}P$ inner guiding layer with a thickness of 50 nm (where the Al mole fraction z=0.30); 51, $Ga_{0.51}In_{0.49}P$ active layers with a thickness of 5.5 nm; 52, $(Al_wGa_{1-w})_{0.51}In_{0.49}P$ barrier layers with a thickness of 5 nm (where the Al mole fraction w=0.50); 53, a p-side $(Al_yGa_{1-y})_{0.51}In_{0.49}P$ guiding layer with a thickness of 300 nm (where the Al mole fraction y=0.50); and 54, a p-type $(Al_xGa_{1-x})_{0.51}In_{0.49}P$ cladding layer with a thickness of 1.5 µm (where the Al mole fraction x=0.70).

The n-side $(Al_yGa_{1-y})_{0.51}In_{0.49}P$ outer guiding layer 49, the n-side $(Al_xGa_{1-x})_{0.51}In_{0.49}P$ inner guiding layer 50, the $(Al_wGa_{1-w})_{0.51}In_{0.49}P$ barrier layers 52, and the p-side $(Al_yGa_{1-y})_{0.51}In_{0.49}P$ guiding layer 53 are undoped or substantially undoped; no intentional doping is performed on these layers. In this example, the undoped layers of the device, which include the guiding layers 49, 50, and 53, the barrier layers 52, and the active layers 51, have a combined thickness Dudp of 976.5 nm, which is approximately 1.45 times the lasing wavelength (see FIG. 11).

Seventh Practical Example

Figure 12:
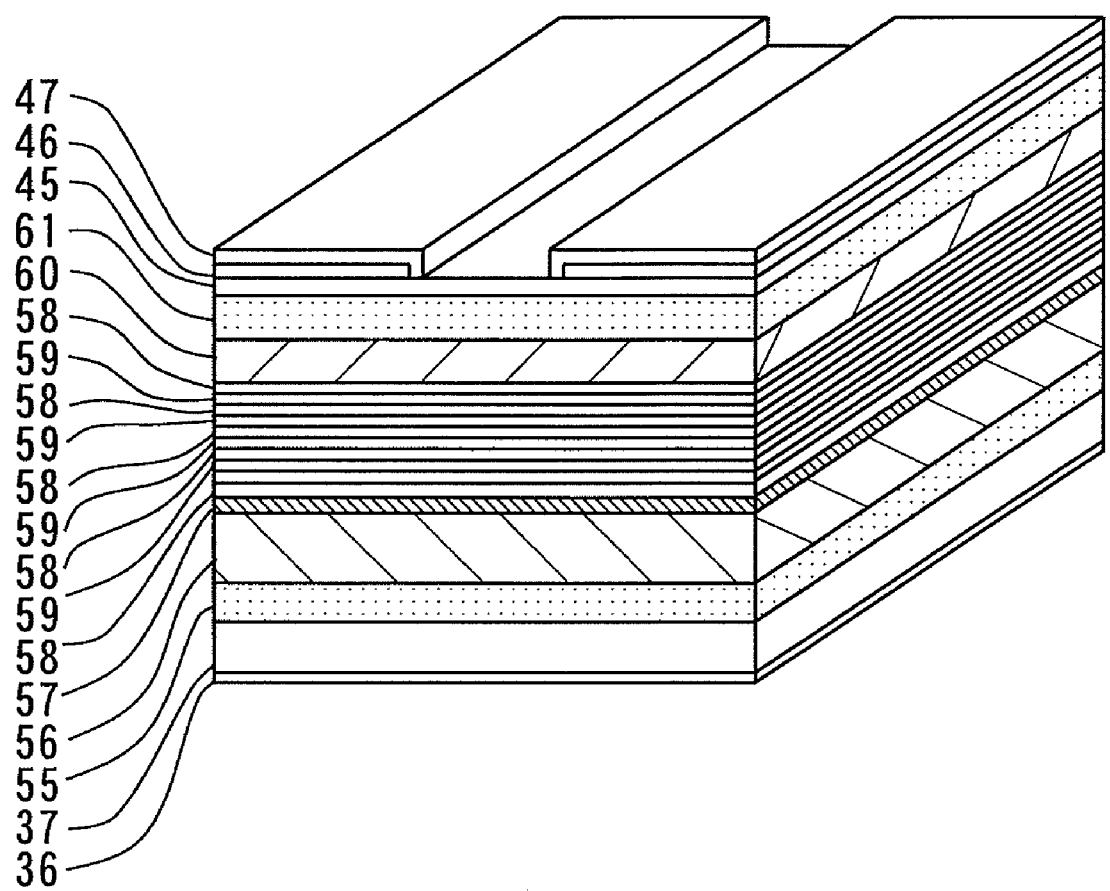
FIG. 12 is a cross-sectional perspective view of a semiconductor laser device according to a seventh practical example of the first embodiment of the present invention.

FIG. 12 is a cross-sectional perspective view of a 1550 nm semiconductor laser device according to a seventh practical example of the present embodiment. Reference numerals and corresponding components in FIG. 12 are as follows: 55, an n-type InP cladding layer with a thickness of 0.75 µm; 56, an n-side $In_{1-x}Ga_xAs_yP_{1-y}$ outer guiding layer with a thickness of 600 nm (where the Ga mole fraction x=0.800 and the As mole fraction y=0.175); 57, an n-side $In_{1-z}Ga_zAs_wP_{1-w}$ inner guiding layer with a thickness 50 nm (where the Ga mole fraction z=0.277 and the As mole fraction w=0.600); 58, $In_{1-s}Ga_sAs_tP_{1-t}$ active layers with a thickness of 8 nm (where the Ga mole fraction s=0.329 and the As mole fraction t=0.710); 59, $In_{1-u}Ga_uAs_vP_{1-v}$ barrier layers with a thickness of 20 nm (where the Ga mole fraction u=0.80 and the As mole fraction v=0.175); 60, a p-side $In_{1-x}Ga_xAs_yP_{1-y}$ guiding layer with a thickness of 300 nm (where the Ga mole fraction x=0.800 and the As mole fraction y=0.175); and 61, a p-type InP cladding layer with a thickness of 0.75 µm.

Thus the semiconductor laser device of this example has a five quantum well structure including five $In_{1-s}Ga_sAs_tP_{1-t}$ active layers with a thickness of 8 nm (where the Ga mole fraction s=0.329 and the As mole fraction t=0.710) to lase at a wavelength of about 1550 nm.

The n-side $In_{1-x}Ga_xAs_yP_{1-y}$ outer guiding layer 56, the n-side $In_{1-z}Ga_zAs_wP_{1-w}$ inner guiding layer 57, the $In_{1-u}Ga_uAs_vP_{1-v}$ barrier layers 59, and the p-side $In_{1-x}Ga_xAs_yP_{1-y}$ guiding layer 60 are undoped or substantially undoped; no intentional doping is performed on these layers. In this example, the undoped layers of the device, which include the guiding layers 56, 57, and 60, the barrier layers 59, and the active layers 58, have a combined thickness Dudp of 1070 nm, which is approximately 0.69 times the lasing wavelength (see FIG. 12).

Second Embodiment

First Practical Example of Second Embodiment

Figure 13:
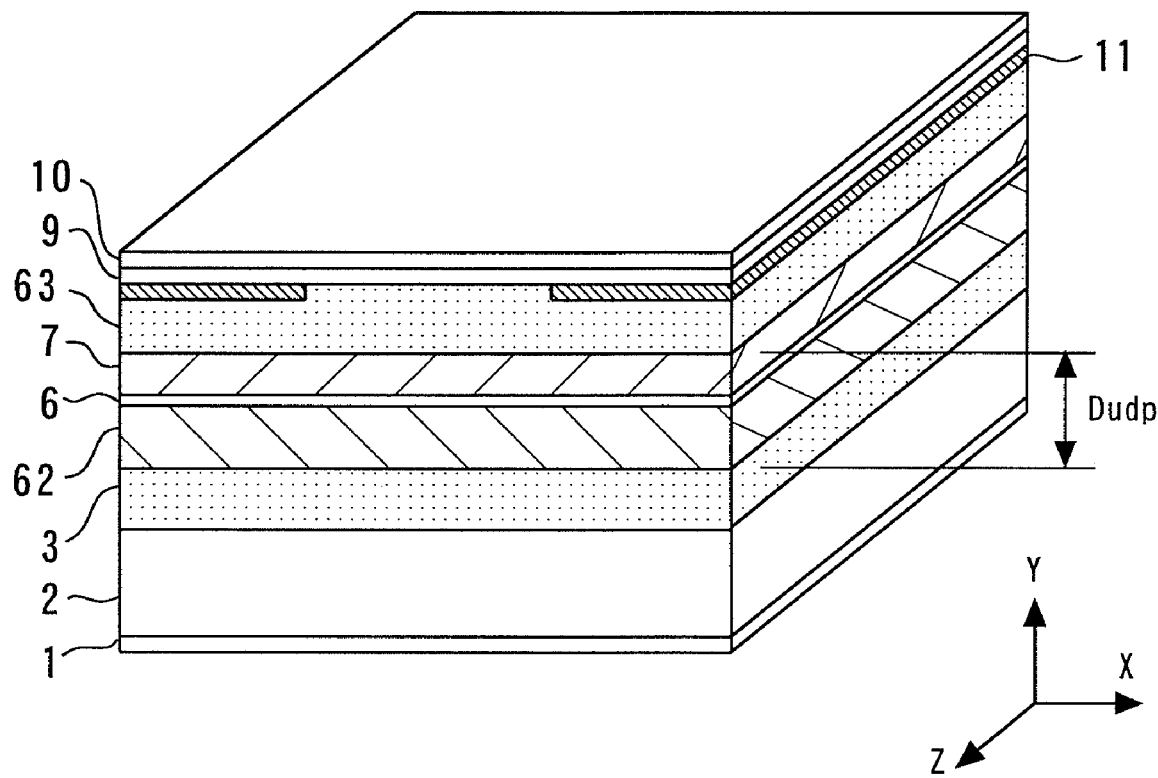
FIG. 13 is a perspective view of a semiconductor laser device according to a second embodiment of the present invention.

FIG. 13 is a perspective view of an 810 nm semiconductor laser device according to a second embodiment of the present invention. Reference numerals and corresponding components in FIG. 13 are as follows: 62, an n-side $Al_yGa_{1-y}As$ guiding layer with a thickness of 700 nm (where y=0.35); and 63, a p-type $Al_tGa_{1-t}As$ cladding layer with a thickness of 1.5 µm (where t=0.60). This semiconductor laser device is substantially similar to that of the first practical example of the first embodiment (shown in FIG. 3) except the configuration of an inner guiding layer.

Since the AlGaAs active layer 6 is located closer to the p-type AlGaAs cladding layer 63 than to the n-type AlGaAs cladding layer 3, fewer carriers are present within the guiding layers, as compared to when the active layer is spaced equally from the n-type and p-type cladding layers. This reduces the free carrier absorption and the resulting loss in the device, thereby increasing the slope efficiency.

Further, since the Al mole fraction t of the p-type $Al_tGa_{1-t}As$ cladding layer 63 is greater than the Al mole fraction x of the n-type $Al_xGa_{1-x}As$ cladding layer 3, the p-type AlGaAs cladding layer 63 has a lower refractive index than the n-type AlGaAs cladding layer 3. This means that the difference in refractive index between the p-side AlGaAs guiding layer 7 and the p-type AlGaAs cladding layer 63 is greater than that between the n-side AlGaAs guiding layer 62 and the n-type AlGaAs cladding layer 3. As a result, the optical intensity distribution in the p-side AlGaAs guiding layer 7 is such that the optical intensity drastically decreases toward the p-type AlGaAs cladding layer 63. This increases the optical confinement factor to the AlGaAs active layer 6, thereby reducing the threshold current.

Further, this semiconductor laser device differs from that of the first practical example of the first embodiment (shown in FIG. 3) substantially only in that it includes only one n-side guiding layer, namely, the n-side $Al_yGa_{1-y}As$ guiding layer 62 (i.e., it does not include an n-side inner guiding layer), as described above. That is, in this embodiment, as in the first embodiment, the p-side guiding layer, the active layer, and the n-side guiding layer are undoped or substantially undoped; no intentional doping is performed on these layers. Further, the sum of the thicknesses of the p-side guiding layer, the active layer, and the n-side guiding layer is at least 0.5 times the lasing wavelength. As a result, most of the laser light exists within these layers, and the free carrier absorption in the cladding layers is reduced.

These features enable the semiconductor laser device to have a high electrical-to-optical power conversion efficiency.

Other Practical Examples of Second Embodiment

Second Practical Example

Figure 14:
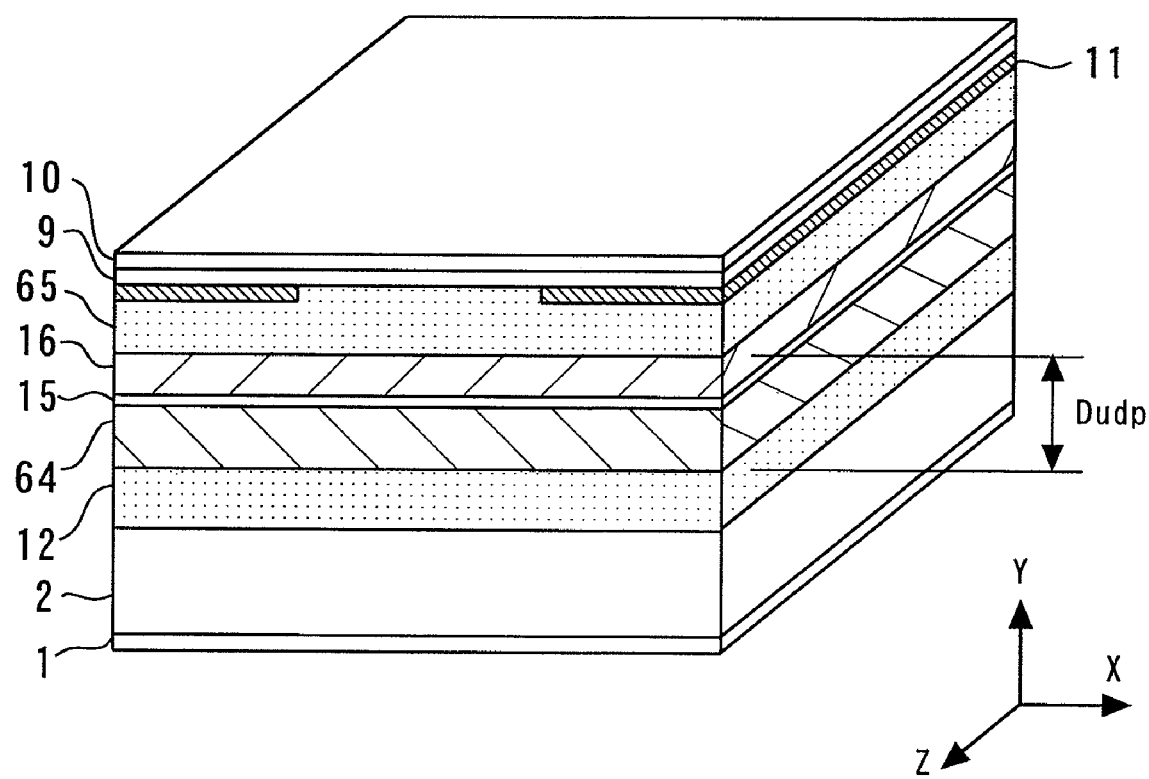
FIG. 14 is a perspective view of a semiconductor laser device according to a second practical example of the second embodiment of the present invention.

FIG. 14 is a perspective view of a 980 nm semiconductor laser device according to a second practical example of the present embodiment. In FIG. 14, reference numeral 64 denotes an n-side $Al_yGa_{1-y}As$ guiding layer with a thickness of 700 nm (where y=0.05), and reference numeral 65 denotes a p-type $Al_tGa_{1-t}As$ cladding layer with a thickness of 1.5 µm (where t=0.35). This semiconductor laser device is substantially similar to that shown in FIG. 7 except the configuration of an inner guiding layer. The n-side $Al_yGa_{1-y}As$ guiding layer 64 and the p-side $Al_sGa_{1-s}As$ guiding layer 16 are undoped or substantially undoped; no intentional doping is performed on these layers.

Third Practical Example

Figure 15:
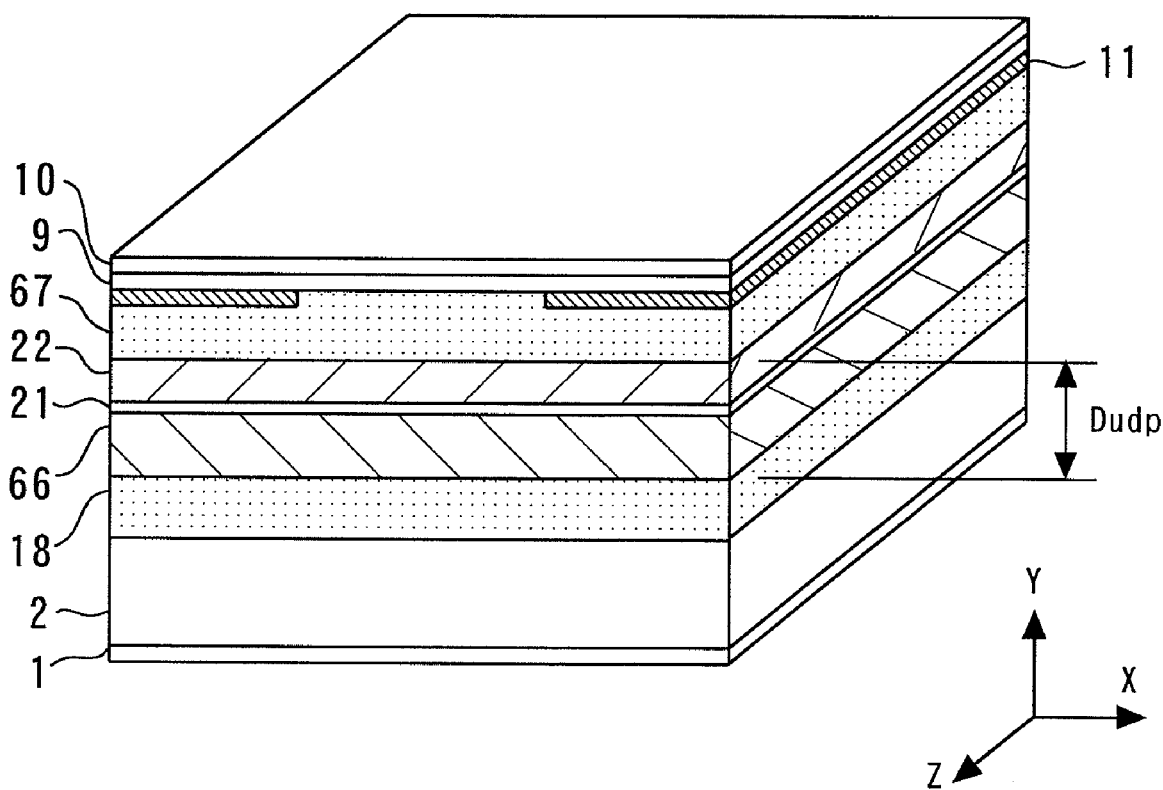
FIG. 15 is a perspective view of a semiconductor laser device according to a third practical example of the second embodiment of the present invention.

FIG. 15 is a perspective view of an 810 nm semiconductor laser device according to a third practical example of the present embodiment. In FIG. 15, reference numeral 66 denotes an n-side InGaP guiding layer with a thickness of 300 nm, and reference numeral 67 denotes a p-type $(Al_xGa_{1-x})_{0.51}In_{0.49}P$ cladding layer with a thickness of 1.5 µm (where x=0.55). This semiconductor laser device is substantially similar to that shown in FIG. 8 except the configuration of an inner guiding layer. The n-side InGaP guiding layer 66 and the p-side InGaP guiding layer 22 are undoped or substantially undoped; no intentional doping is performed on these layers.

Fourth Practical Example

Figure 16:
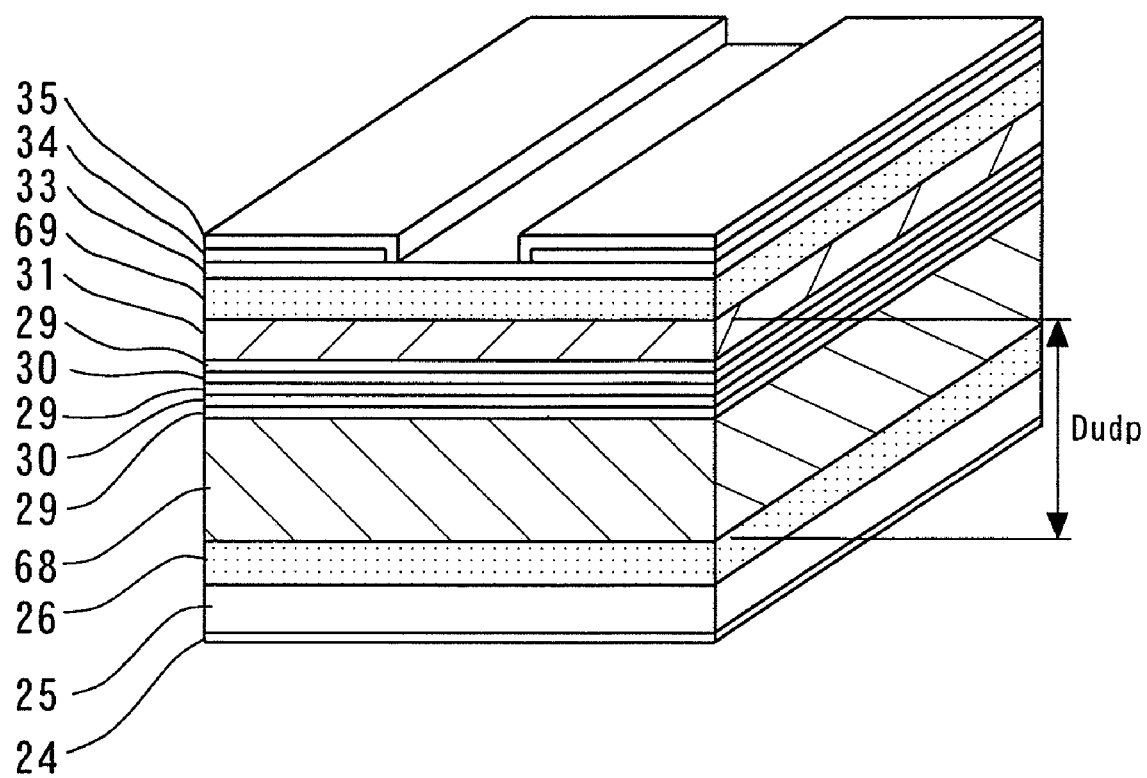
FIG. 16 is a perspective view of a semiconductor laser device according to a fourth practical example of the second embodiment of the present invention.

FIG. 16 is a perspective view of a 400 nm semiconductor laser device according to a fourth practical example of the present embodiment. In FIG. 16, reference numeral 68 denotes an n-side GaN guiding layer with a thickness of 350 nm, and reference numeral 69 denotes a p-type $Al_xGa_{1-x}N$ cladding layer with a thickness of 0.5 µm (where the Al mole fraction x=0.16). This semiconductor laser device is substantially similar to that shown in FIG. 9 except the configuration of an inner guiding layer. The n-side GaN guiding layer 68, the GaN barrier layers 30, and the p-side GaN guiding layer 31 are undoped or substantially undoped; no intentional doping is performed on these layers.

Fifth Practical Example

Figure 17:
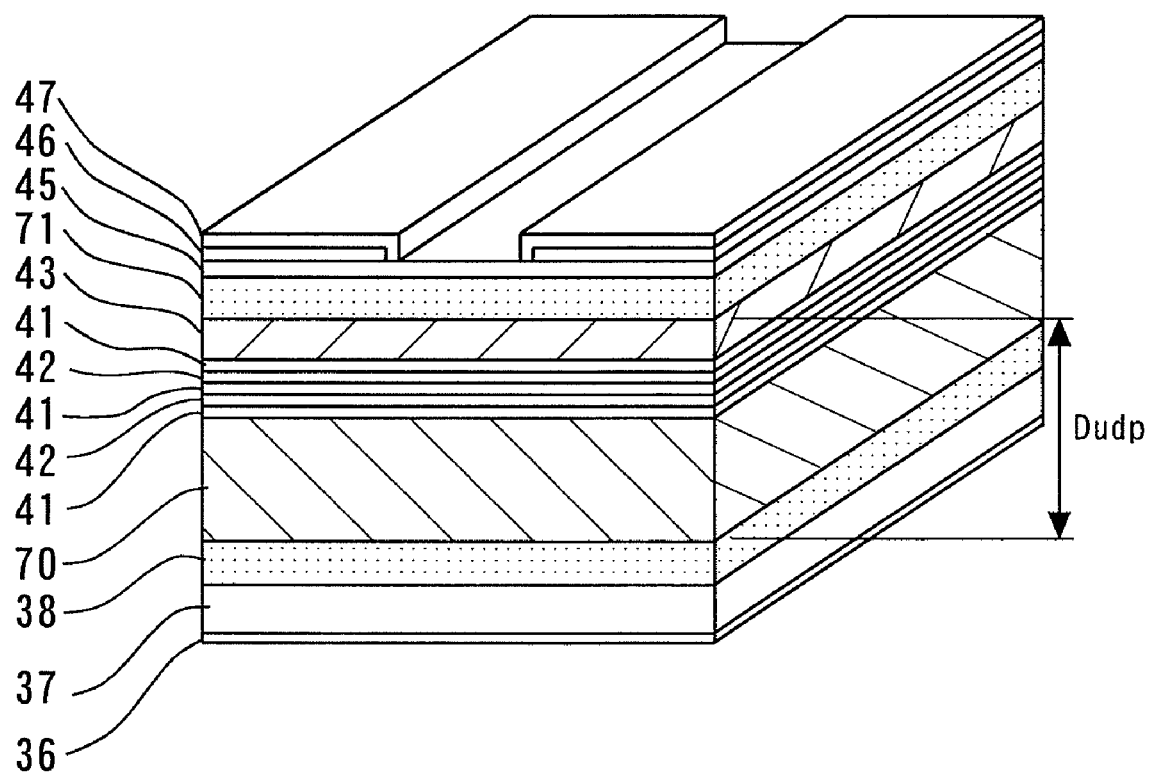
FIG. 17 is a cross-sectional perspective view of a semiconductor laser device according to a fifth practical example of the second embodiment of the present invention.

FIG. 17 is a cross-sectional perspective view of a 1310 nm semiconductor laser device according to a fifth practical example of the present embodiment. In FIG. 17, reference numeral 70 denotes an n-side $In_{1-z}Ga_zAs_wP_{1-w}$ guiding layer with a thickness of 650 nm (where the Ga mole fraction z=0.262 and the As mole fraction w=0.568), and reference numeral 71 denotes a p-type $In_{1-x}Ga_xAs_yP_{1-y}$ cladding layer with a thickness of 500 nm (where the Ga mole fraction x=0.160 and the As mole fraction y=0.350). This semiconductor laser device is substantially similar to that shown in FIG. 10 except the configuration of an inner guiding layer. The n-side $In_{1-z}Ga_zAs_wP_{1-w}$ guiding layer 70, the $In_{1-q}Ga_qAs_rP_{1-r}$ barrier layers 42, and the p-side $In_{1-z}Ga_zAs_wP_{1-w}$ guiding layer 43 are undoped or substantially undoped; no intentional doping is performed on these layers.

Sixth Practical Example

Figure 18:
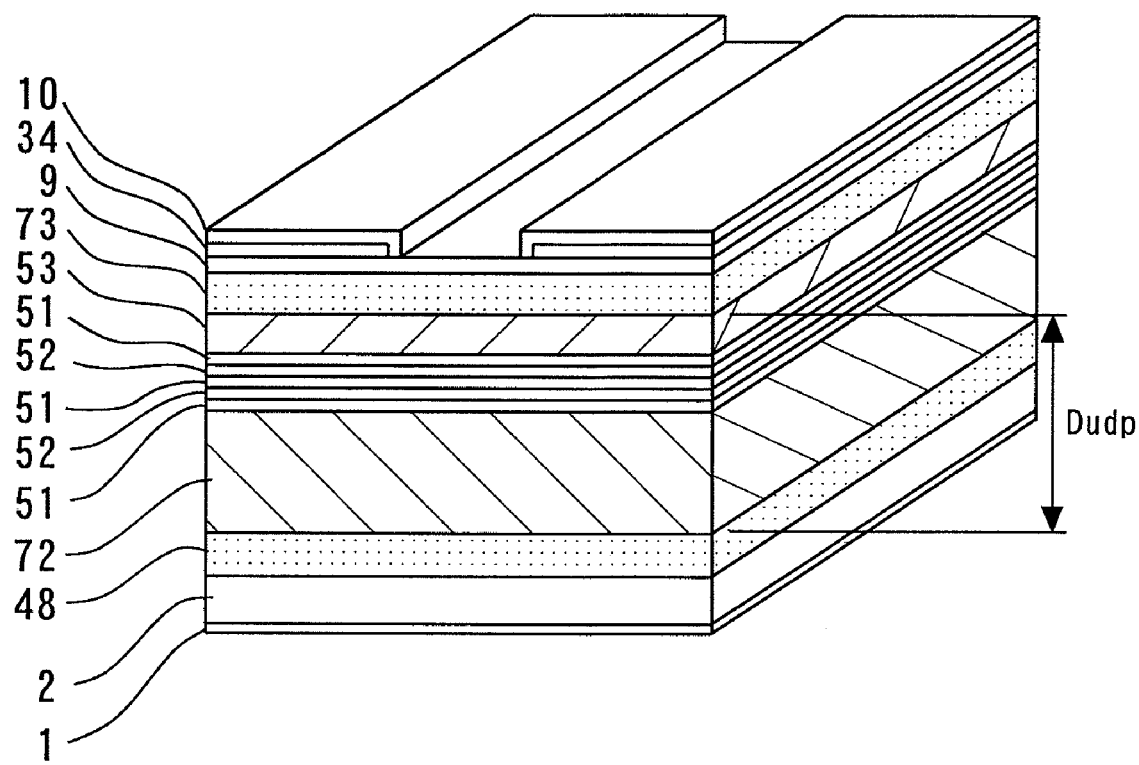
FIG. 18 is a perspective view of a semiconductor laser device according to a sixth practical example of the second embodiment of the present invention.

FIG. 18 is a perspective view of a 660 nm semiconductor laser device according to a sixth practical example of the present embodiment. In FIG. 18, reference numeral 72 denotes an n-side $(Al_yGa_{1-y})_{0.51}In_{0.49}P$ guiding layer with a thickness of 650 nm (where the Al mole fraction y=0.50), and reference numeral 73 denotes a p-type $(Al_xGa_{1-x})_{0.51}In_{0.49}P$ cladding layer with a thickness of 1.5 μm (where the Al mole fraction x=0.80). This semiconductor laser device is substantially similar to that shown in FIG. 11, except the configuration of an inner guiding layer. The n-side $(Al_yGa_{1-y})_{0.51}In_{0.49}P$ guiding layer 72, the $(Al_wGa_{1-w})_{0.51}In_{0.49}P$ barrier layers 52, and the p-side $(Al_yGa_{1-y})_{0.51}In_{0.49}P$ guiding layer 53 are undoped or substantially undoped; no intentional doping is performed on these layers.

Seventh Practical Example

Figure 19:
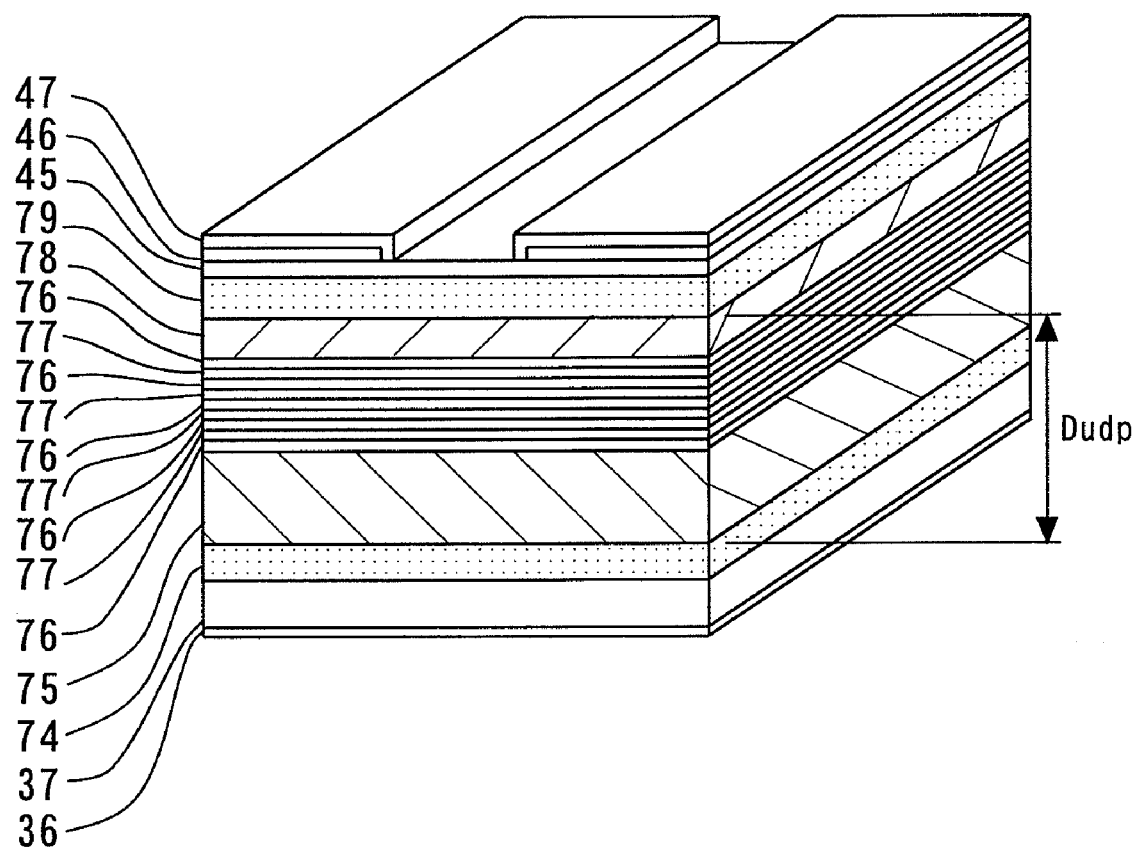
FIG. 19 is a cross-sectional perspective view of a semiconductor laser device according to a seventh practical example of the second embodiment of the present invention.

FIG. 19 is a cross-sectional perspective view of a 1550 nm semiconductor laser device according to a seventh practical example of the present embodiment. In FIG. 19, reference numeral 74 denotes an n-type $In_{1-x}Ga_xAs_yP_{1-y}$ cladding layer with a thickness of 1.0 μm (where the Ga mole fraction x=0.023 and the As mole fraction y=0.050); 75, an n-side $In_{1-z}Ga_zAs_wP_{1-w}$ guiding layer with a thickness of 650 nm (where the Ga mole fraction z=0.800 and the As mole fraction w=0.175); 76, $In_{1-s}Ga_sAs_tP_{1-t}$ active layers with a thickness of 8 nm (where the Ga mole fraction s=0.329 and the As mole fraction t=0.710); 77, $In_{1-u}Ga_uAs_vP_{1-v}$ barrier layers with a thickness of 20 nm (where the Ga mole fraction u=0.800 and the As mole fraction v=0.175); 78, a p-side $In_{1-z}Ga_zAs_wP_{1-w}$ guiding layer with a thickness of 300 nm (where the Ga mole fraction z=0.800 and the As mole fraction w=0.175); and 79, a p-type InP cladding layer with a thickness of 1.0 μm.

Thus the semiconductor laser device of this example has a five quantum well structure including five $In_{1-s}Ga_sAs_tP_{1-t}$ active layers with a thickness of 8 nm (where the Ga mole fraction s=0.329 and the As mole fraction t=0.710) to lase at a wavelength of about 1550 nm.

The n-side $In_{1-z}Ga_zAs_wP_{1-w}$ guiding layer 75, the $In_{1-u}Ga_uAs_vP_{1-v}$ barrier layers 77, and the p-side $In_{1-z}Ga_zAs_wP_{1-w}$ guiding layer 78 are undoped or substantially undoped; no intentional doping is performed on these layers.

Third Embodiment

First Practical Example of Third Embodiment

Figure 20:
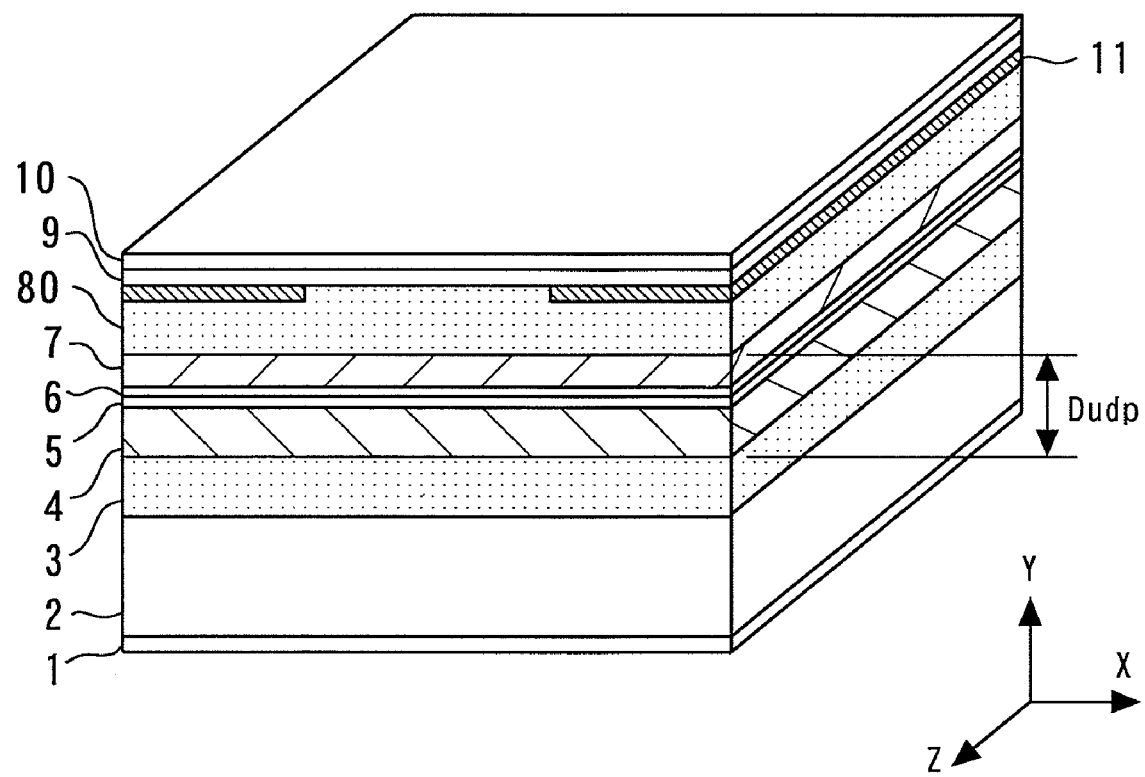
FIG. 20 is a perspective view of a semiconductor laser device according to a first practical example of a third embodiment of the present invention.

FIG. 20 is a perspective view of an 810 nm semiconductor laser device according to a third embodiment of the present invention. In FIG. 20, reference numeral 80 denotes a p-type $Al_tGa_{1-t}As$ cladding layer with a thickness of 1.5 μm (where t=0.60). This semiconductor laser device is similar to that shown in FIG. 3, except that the p-type cladding layer 8 is replaced by the p-type $Al_tGa_{1-t}As$ cladding layer 80. Since the AlGaAs active layer 6 is located closer to the p-type AlGaAs cladding layer 80 than to the n-type AlGaAs cladding layer 3, fewer carriers are present within the guiding layers, as compared to when the active layer is spaced equally from the n-type and p-type cladding layers. This reduces the free carrier absorption and the resulting loss in the device, thereby increasing the slope efficiency.

Further, the n-side inner guiding layer has a higher refractive index than the p-side guiding layer, by forming the n-side guiding layer having two layers. As a result, the peak of the optical intensity distribution is close to the active layer, and the optical confinement factor, i.e., the percentage of light confined to the active layer, of the present embodiment is higher than that of the configuration which the n-side inner guiding layer and the p-side guiding layer have the same refractive index.

Further, since the Al mole fraction t of the p-type $Al_tGa_{1-t}As$ cladding layer 80 is greater than the Al mole fraction x of the n-type $Al_xGa_{1-x}As$ cladding layer 3, the p-type AlGaAs cladding layer 80 has a lower refractive index than the n-type AlGaAs cladding layer 3. This means that the difference in refractive index between the p-side AlGaAs guiding layer 7 and the p-type AlGaAs cladding layer 80 is greater than that between the n-side AlGaAs guiding layer 4 and the n-type AlGaAs cladding layer 3. As a result, the optical intensity distribution in the p-side AlGaAs guiding layer 7 is such that the optical intensity drastically decreases toward the p-type AlGaAs cladding layer 80. This increases the optical confinement factor to the AlGaAs active layer 6, thereby reducing the threshold current.

Further, this semiconductor laser device differs from that of the first practical example of the first embodiment (shown in FIG. 3) only in that the p-type cladding layer 8 is replaced by the p-type $Al_tG_{1-t}As$ cladding layer 80, as described above. That is, in this embodiment, as in the first embodiment, the p-side guiding layer, the active layer, and the n-side guiding layers are undoped or substantially undoped; no intentional doping is performed on these layers. Further, the sum of the thicknesses of the p-side guiding layer, the active layer, and the n-side guiding layers is at least 0.5 times the lasing wavelength. As a result, most of the laser light exists within these layers, and the free carrier absorption in the cladding layers is reduced.

These features enable the semiconductor laser device to have a high electrical-to-optical power conversion efficiency.

Other Practical Examples of Third Embodiment

Second Practical Example

Figure 21:
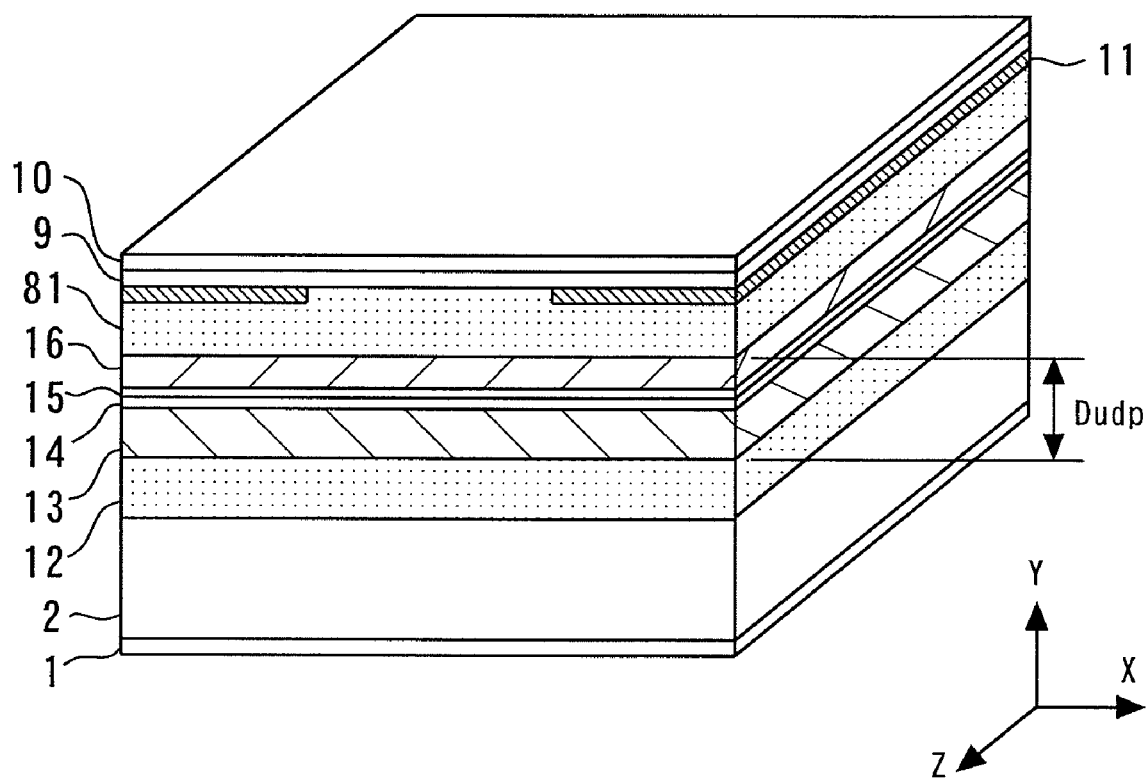
FIG. 21 is a perspective view of a semiconductor laser device according to a second practical example of the third embodiment of the present invention.

FIG. 21 is a perspective view of a 980 nm semiconductor laser device according to a second practical example of the present embodiment. In FIG. 21, reference numeral 81 denotes a p-type $Al_tGa_{1-t}As$ cladding layer with a thickness of 1.5 μm (where t=0.35). This semiconductor laser device is similar to that shown in FIG. 7, except that the p-type cladding layer 17 is replaced by the p-type $Al_tGa_{1-t}As$ cladding layer 81. The n-side $Al_yGa_{1-y}As$ outer guiding layer 13, the n-side GaAs inner guiding layer 14, and the p-side $Al_sGa_{1-s}As$ guiding layer 16 are undoped or substantially undoped; no intentional doping is performed on these layers.

Third Practical Example

Figure 22:
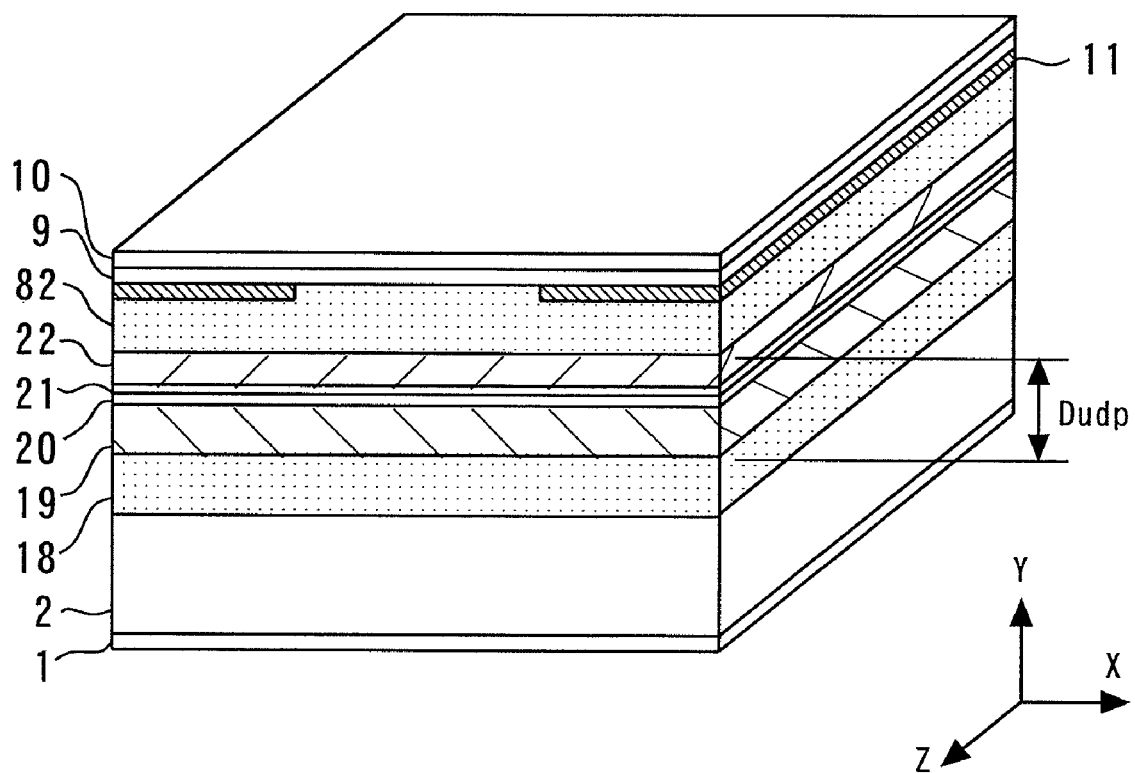
FIG. 22 is a perspective view of a semiconductor laser device according to a third practical example of the third embodiment of the present invention.

FIG. 22 is a perspective view of an 810 nm semiconductor laser device according to a third practical example of the present embodiment. In FIG. 22, reference numeral 82 denotes a p-type $(Al_xGa_{1-x})_{0.51}In_{0.49}P$ cladding layer with a thickness of 1.5 μm (where x=0.55). This semiconductor laser device is similar to that shown in FIG. 8, except that the p-type cladding layer 23 is replaced by the p-type $(Al_xGa_{1-x})_{0.51}In_{0.49}P$ cladding layer 82. The n-side InGaP outer guiding layer 19, the n-side $In_{1-y}Ga_yAs_zP_{1-z}$ inner guiding layer 20, and the p-side InGaP guiding layer 22 are undoped or substantially undoped; no intentional doping is performed on these layers.

Fourth Practical Example

Figure 23:
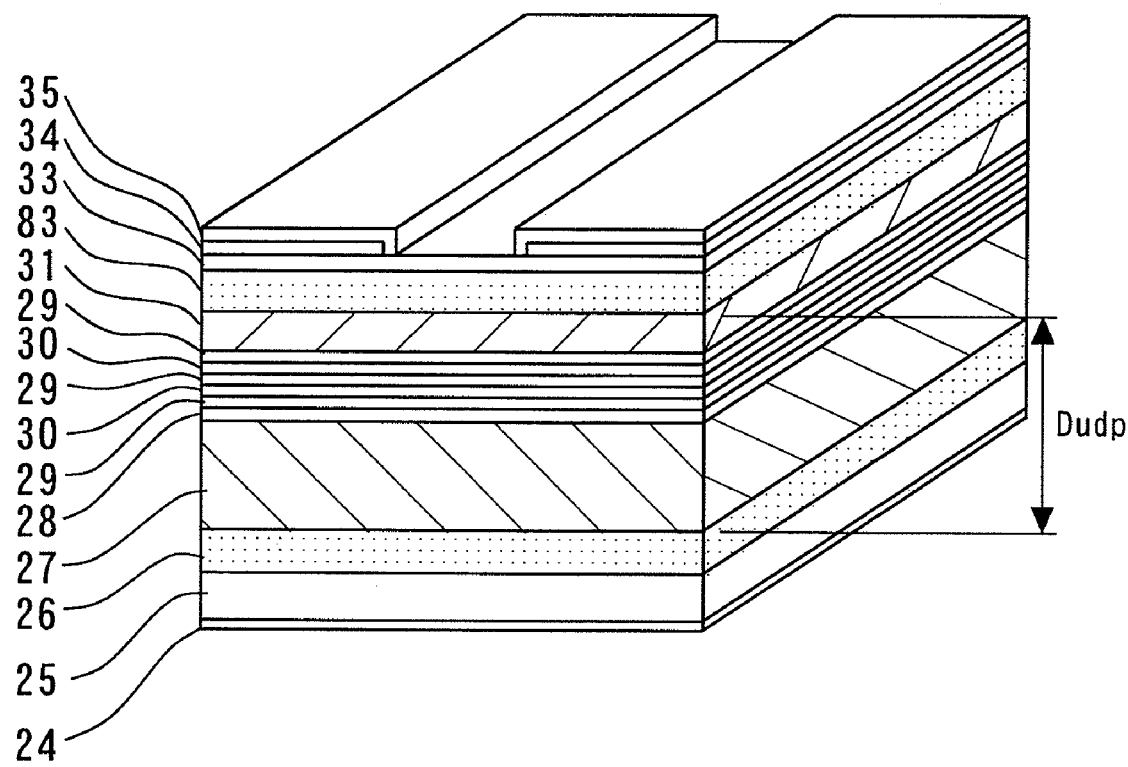
FIG. 23 is a perspective view of a semiconductor laser device according to a fourth practical example of the third embodiment of the present invention.

FIG. 23 is a perspective view of a 400 nm semiconductor laser device according to a fourth practical example of the present embodiment. In FIG. 23, reference numeral 83 denotes a p-type $Al_xGa_{1-x}N$ cladding layer with a thickness of 0.5 μm (where the Al mole fraction x=0.16). This semiconductor laser device is similar to that shown in FIG. 9, except that the p-type cladding layer 32 is replaced by the p-type $Al_xGa_{1-x}N$ cladding layer 83. The n-side GaN outer guiding layer 27, the n-side $In_yGa_{1-y}N$ inner guiding layer 28, the GaN barrier layers 30, and the p-side GaN guiding layer 31 are undoped or substantially undoped; no intentional doping is performed on these layers.

Fifth Practical Example

Figure 24:
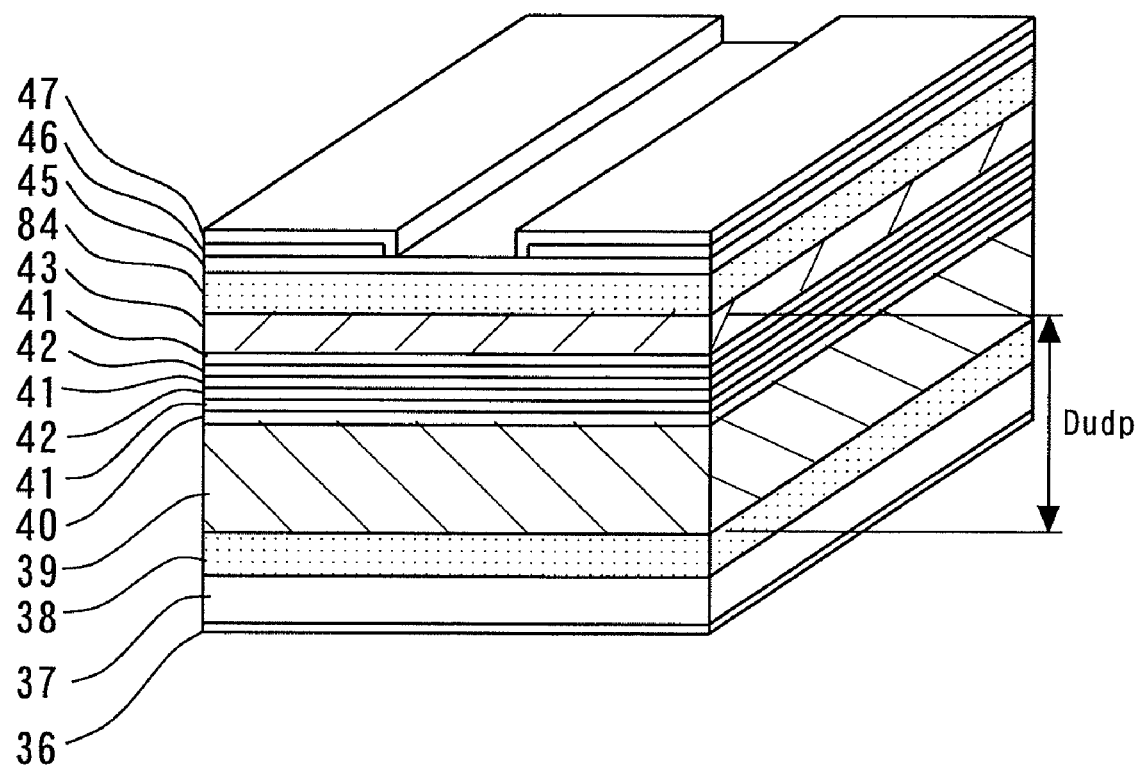
FIG. 24 is a cross-sectional perspective view of a semiconductor laser device according to a fifth practical example of the third embodiment of the present invention.

FIG. 24 is a cross-sectional perspective view of a 1310 nm semiconductor laser device according to a fifth practical example of the present embodiment. In FIG. 24, reference numeral 84 denotes a p-type $In_{1-x}Ga_xAs_yP_{1-y}$ cladding layer with a thickness of 500 nm (where the Ga mole fraction x=0.160 and the As mole fraction y=0.35). This semiconductor laser device is similar to that shown in FIG. 10, except that the p-type cladding layer 44 is replaced by the p-type $In_{1-x}Ga_xAs_yP_{1-y}$ cladding layer 84. The n-side $In_{1-z}Ga_zAs_wP_{1-w}$ outer guiding layer 39, the n-side $In_{1-s}Ga_sAs_tP_{1-t}$ inner guiding layer 40, the $In_{1-q}Ga_qAs_rP_{1-r}$ barrier layers 42, and the p-side $In_{1-z}Ga_zAs_wP_{1-w}$ guiding layer 43 are undoped or substantially undoped; no intentional doping is performed on these layers.

Sixth Practical Example

Figure 25:
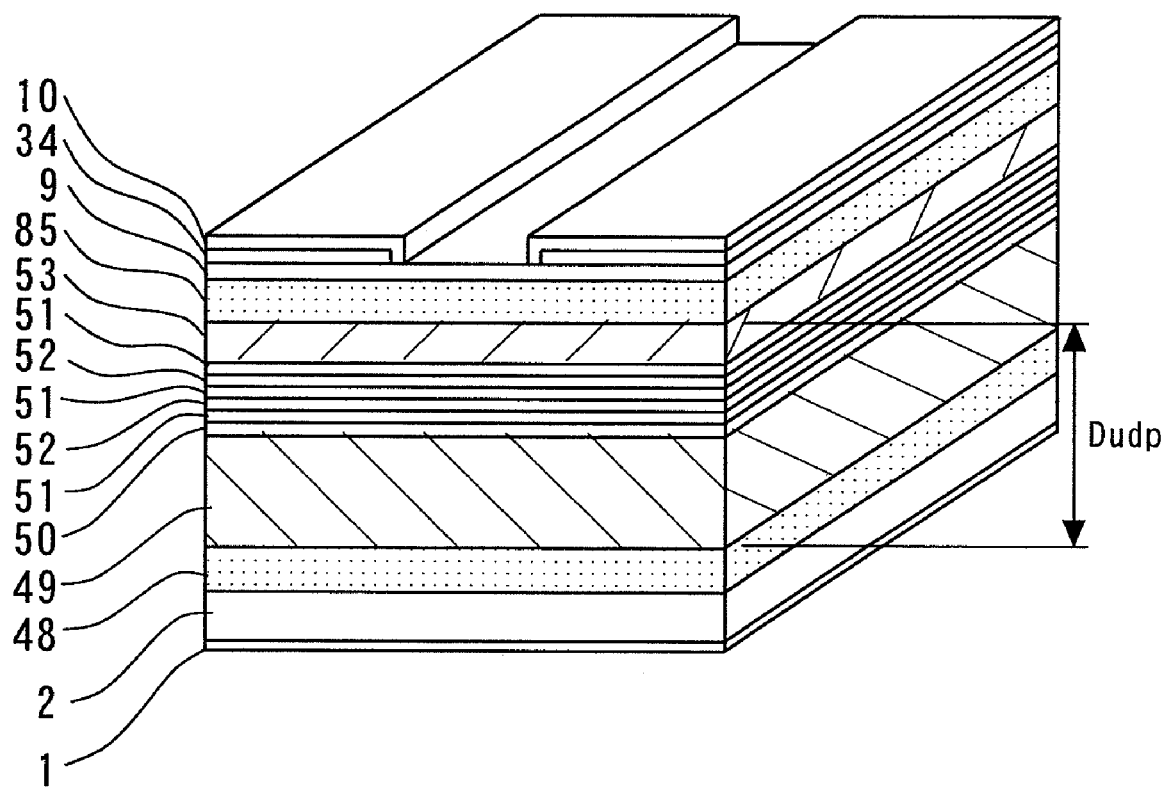
FIG. 25 is a perspective view of a semiconductor laser device according to a sixth practical example of the third embodiment of the present invention.

FIG. 25 is a perspective view of a 660 nm semiconductor laser device according to a sixth practical example of the present embodiment. In FIG. 25, reference numeral 85 denotes a p-type $(Al_xGa_{1-x})_{0.51}In_{0.49}P$ cladding layer with a thickness of 1.5 μm (where the Al mole fraction x=0.80). This semiconductor laser device is similar to that shown in FIG. 11, except that the p-type cladding layer 54 is replaced by the p-type $(Al_xGa_{1-x})_{0.51}In_{0.49}P$ cladding layer 85. The n-side $(Al_yGa_{1-y})_{0.51}In_{0.49}P$ outer guiding layer 49, the n-side $(Al_zGa_{1-z})_{0.51}In_{0.49}P$ inner guiding layer 50, the $(Al_wGa_{1-w})_{0.51}In_{0.49}P$ barrier layers 52, and the p-side $(Al_yGa_{1-y})_{0.51}In_{0.49}P$ guiding layer 53 are undoped or substantially undoped; no intentional doping is performed on these layers.

Seventh Practical Example

Figure 26:
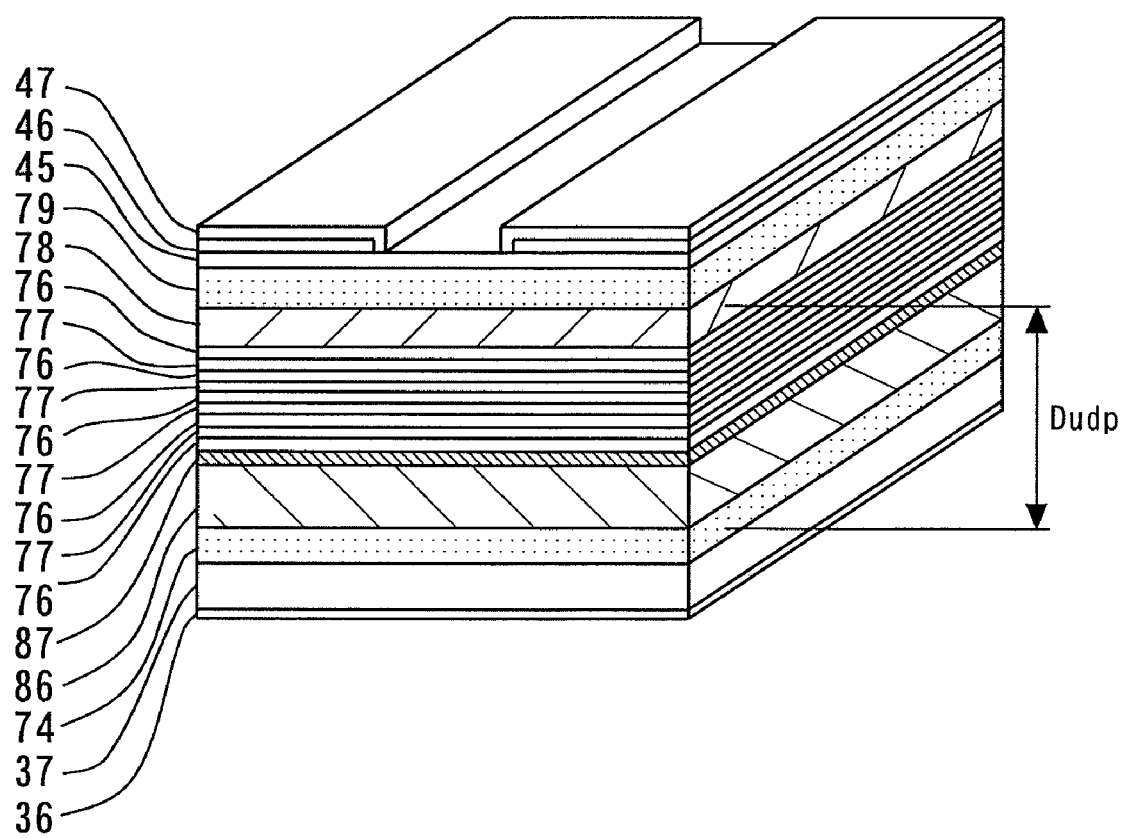
FIG. 26 is a cross-sectional perspective view of a semiconductor laser device according to a seventh practical example of the third embodiment of the present invention.

FIG. 26 is a cross-sectional perspective view of a 1550 nm semiconductor laser device according to a seventh practical example of the present embodiment. In FIG. 26, reference numeral 86 denotes an n-side $In_{1-x}Ga_xAs_yP_{1-y}$ outer guiding layer with a thickness of 600 nm (where the Ga mole fraction x=0.800 and the As mole fraction y=0.175), and reference numeral 87 denotes an n-side $In_{1-z}Ga_zAs_wP_{1-w}$ inner guiding layer with a thickness of 500 nm (where the Ga mole fraction z=0.277 and the As mole fraction w=0.600). This semiconductor laser device is similar to that shown in FIG. 19, except that the n-side guiding layer 75 is replaced by the n-side $In_{1-x}Ga_xAs_yP_{1-y}$ outer guiding layer 86 and the n-side $In_{1-z}Ga_zAs_wP_{1-w}$ inner guiding layer 87. The n-side $In_{1-x}Ga_xAs_yP_{1-y}$ outer guiding layer 86, the n-side $In_{1-z}Ga_zAs_wP_{1-w}$ inner guiding layer 87, the $In_{1-u}Ga_uAs_vP_{v-1}$ barrier layers 77, and the p-side $In_{1-z}Ga_zAs_wP_{1-w}$ guiding layer 78 are undoped or substantially undoped; no intentional doping is performed on these layers.

Fourth Embodiment

First Practical Example of Fourth Embodiment

Figure 27:
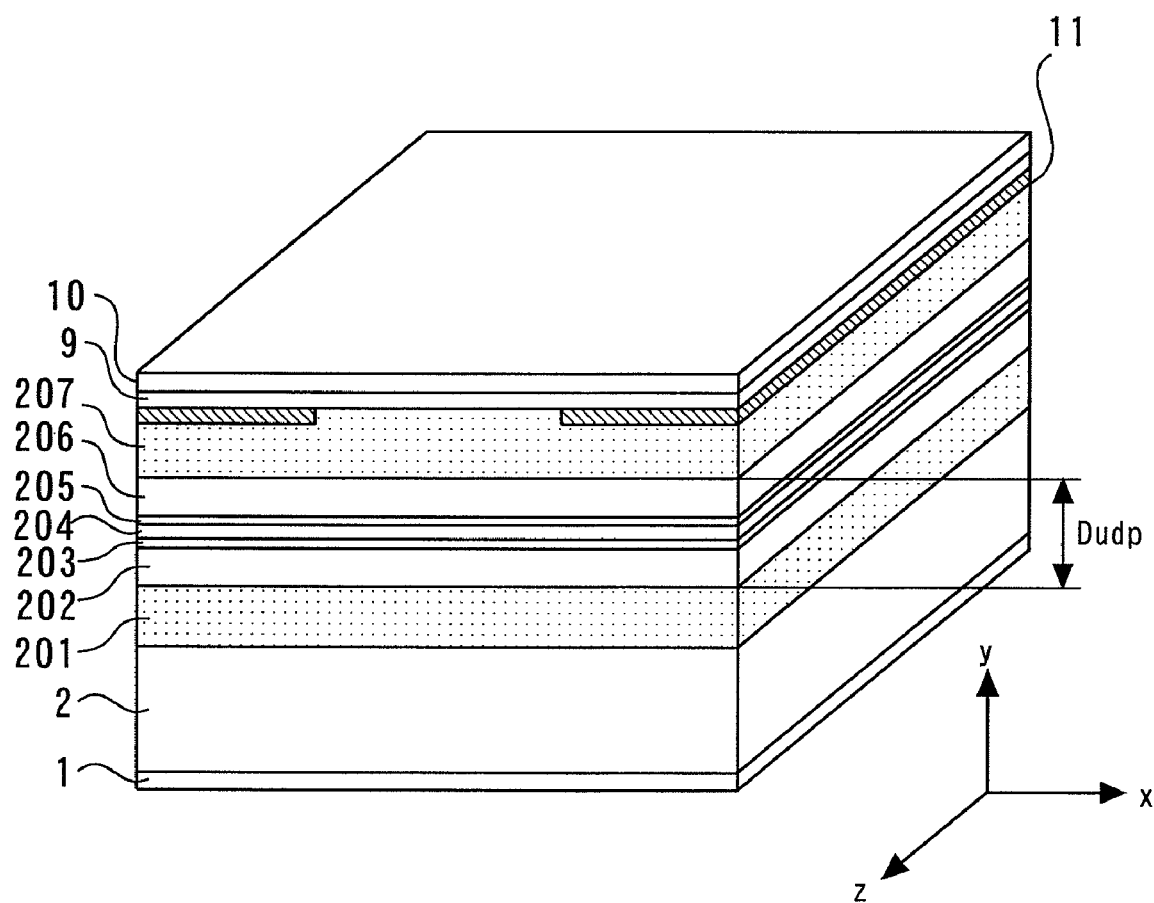
FIG. 27 is a perspective view of a semiconductor laser device according to a first practical example of a fourth embodiment of the present invention.

FIG. 27 is a perspective view of an 810 nm semiconductor laser device according to a fourth embodiment of the present invention. Reference numerals and corresponding components in FIG. 27 are as follows: 201 denotes an n-type $(Al_xGa_{1-x})_{0.51}In_{0.49}P$ cladding layer with a thickness of 1.5 μm (where the Al mole fraction x=0.30); 202 denotes an n-side InGaP outer guiding layer with a thickness of 630 nm; 203 denotes an n-side $In_{1-y}Ga_yAs_zP_{1-z}$ center guiding layer with a thickness of 100 nm (where z=0.10 and y=0.56); 204 denotes an n-side InGaP inner guiding layer with a thickness of 20 nm; 205 denotes a $GaAs_{1-w}P_w$ active layer with a thickness of 12.5 nm (where w=0.12); 206 denotes a p-side InGaP guiding layer with a thickness of 450 nm; and 207 denotes a p-type $(Al_xGa_{1-x})_{0.51}In_{0.49}P$ cladding layer with a thickness of 1.5 μm (where x=0.30).

In the above described configuration, the GaAsP active layer 205 is sandwiched by the n-side guiding layers and the p-side guiding layer, and the total thickness of the n-side guiding layer is larger than the thickness of the p-side guiding layer. That is, the GaAsP active layer 205 is located so as to be close to the p-type AlGaInP cladding layer 207. According to this configuration, carriers residing within the guiding layers are reduced, as compared to a case where the active layer locates at the middle between the n-type and p-type cladding layers. This reduces the loss due to the free carrier absorption, thereby improving the slope efficiency.

Further, in the fourth embodiment, the n-side guiding layer consists of three layers, and the center layer of the three layers has the highest refractive index of the three layers. Thereby, in the fourth embodiment, the n-side guiding layer has a higher refractive index than the p-side guiding layer. This results in that the portion in which the optical intensity distribution is maximized is close to the active layer. The optical confinement factor, i.e. the percentage of light confined within the active layer is approximately 1.7% in a case where the refractive index of the inner layer of the n-side guiding layer is equal to that of the outer layers of the n-side guiding layer. On the other hand, the optical confinement factor of the fourth embodiment is approximately 1.8%. The semiconductor laser device according to the fourth embodiment can obtain increased optical confinement factor.

Further, the n-side InGaP inner guiding layer 204, which contacts to the $GaAs_{1-w}P_w$ active layer 205, has a greater band gap energy than the n-side $In_{1-y}Ga_yAs_zP_{1-z}$ center guiding layer. This suppresses leakage of carriers (electrons or holes) to the n-side guiding layer, thereby confining carriers in the GaAs active layer effectively. As a result, a high electrical-to-optical power conversion efficiency can be achieved.

In the fourth embodiment, as in the first embodiment, the p-side guiding layer, the active layer, and the n-side guiding layers are made to be undoped or substantially undoped by performing no intentional doping on these layers. Further, the sum of the thicknesses of the p-side guiding layer, the active layer, and the n-side guiding layers is at least 0.5 times the lasing wavelength. That is, the thickness indicated by Dudp in FIG. 27 is equal to or larger than 0.5 times the lasing wavelength. As a result, most of the laser light exists within these layers, and the free carrier absorption in the cladding layers is reduced.

These features enable the semiconductor laser device to have a high electrical-to-optical power conversion efficiency.

Other Practical Examples of Fourth Embodiment
Second Practical Example

Figure 28:
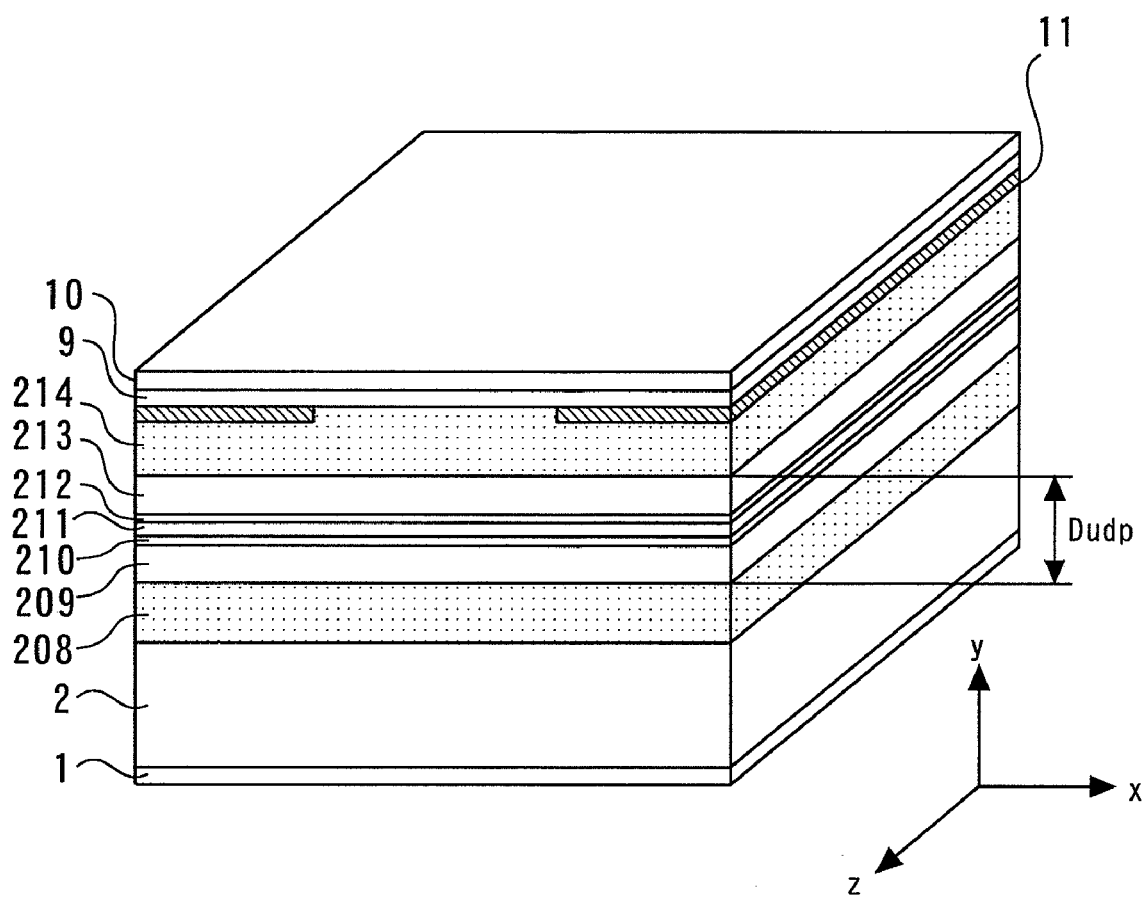
FIG. 28 is a perspective view of a semiconductor laser device according to a second practical example of the fourth embodiment of the present invention.

FIG. 28 is a perspective view of a 915 nm semiconductor laser device according to a second practical example of the fourth embodiment. Reference numerals and corresponding components in FIG. 28 are as follows: 208 denotes an n-type $In_{0.49}Ga_{0.51}P$ cladding layer with a thickness of 1.5 μm; 209 denotes an n-side $In_{1-s}Ga_sAs_tP_{1-t}$ outer guiding layer with a thickness of 600 nm (where t=0.6 and s=0.8); 210 denotes an n-side $In_{1-y}Ga_yAs_zP_{1-z}$ center guiding layer with a thickness of 100 nm (where z=0.7 and y=0.85); 211 denotes an n-side $In_{1-s}Ga_sAs_tP_{1-t}$ inner guiding layer with a thickness of 50 nm (where t=0.6 and s=0.8); 212 denotes a $In_wGa_{1-w}As$ active layer with a thickness of 12.5 nm (where w=0.05); 213 denotes a p-side $In_{1-s}Ga_sAs_tP_{1-t}$ guiding layer with a thickness of 450 nm (where t=0.6 and s=0.8); and 214 denotes a p-type $In_{0.49}Ga_{0.51}P$ cladding layer with a thickness of 1.5 μm.

The n-side $In_{1-s}Ga_sAs_tP_{1-t}$ outer guiding layer 209, the n-side $In_{1-y}Ga_yAs_zP_{1-z}$ center guiding layer 210, the n-side $In_{1-s}Ga_sAs_tP_{1-t}$ inner guiding layer 211, the $In_wGa_{1-w}As$ active layer 212, and the p-side $In_{1-s}Ga_sAs_tP_{1-t}$ guiding layer 213 are made to be undoped or substantially undoped by performing no intentional doping on these layers. Further, the thickness indicated by Dudp in FIG. 28 is equal to or larger than 0.5 times the lasing wavelength, as in the first practical example.

In the fourth embodiment, description is made about an 810 nm semiconductor laser device and a 915 nm semiconductor laser device. It is to be understood, however, that the feature of the fourth embodiment may be applied to other semiconductor lasers made of other materials or other wavelength semiconductor lasers.

Fifth Embodiment
First Practical Example of Fifth Embodiment

Figure 29:
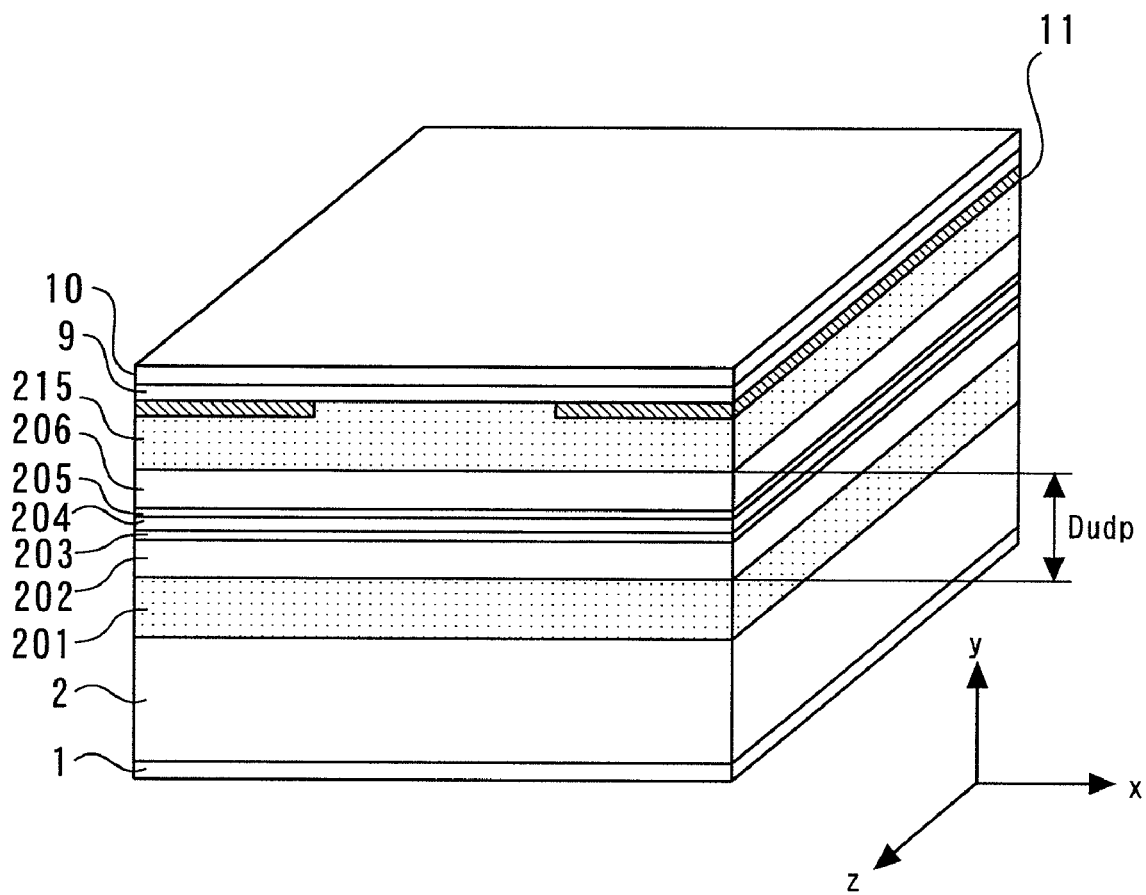
FIG. 29 is a perspective view of a semiconductor laser device according to a first practical example of a fifth embodiment of the present invention.

FIG. 29 is a perspective view of an 810 nm semiconductor laser device according to a fifth embodiment of the present invention. Reference numeral and corresponding component in FIG. 29 is as follows: 215 denotes a p-type $(Al_xGa_{1-x})_{0.51}In_{0.49}P$ cladding layer with a thickness of 1.5 μm (where x=0.40). Other components shown in FIG. 29 are same as the components of the semiconductor laser shown in FIG. 27.

In the fifth embodiment, the GaAsP active layer 205 is sandwiched by the n-side guiding layer and the p-side guiding layer, and the total thickness of the n-side guiding layer is larger than the thickness of the p-side guiding layer as in the fourth embodiment. That is, the GaAsP active layer 205 is located so as to be close to the p-type AlGaInP cladding layer 215. According to this configuration, fewer carriers are present within the guiding layers, as compared to a case where the active layer locates at the middle between the n-type and p-type cladding layers. This reduces the loss due to free carrier absorption in the device, thereby increasing the slope efficiency.

Further, in the fifth embodiment, the n-side guiding layer consists of three layers, and the center layer of the three layers has the highest refractive index of the three layers. Thereby, in the fifth embodiment, the n-side guiding layer has a higher refractive index than the p-side guiding layer. This results in that the portion in which the optical intensity distribution is maximized is close to the active layer.

Further, in the fifth embodiment, the p-type cladding layer 215 has a lower refractive index than the n-type cladding layer 201. As a result, the optical intensity distribution in the p-side InGaP guiding layer 206 is such that the optical intensity drastically decreases toward the p-type AlGaInP cladding layer 215. This increases the optical confinement factor to the GaAsP active layer 205

Further, then-side InGaP inner guiding layer 204, which contacts to the GaAsP active layer 205, has a greater band gap energy than the n-side InGaAsP center guiding layer. This suppresses leakage of carriers (electrons or holes) to the n-side guiding layer, thereby confining carriers in the GaAs active layer effectively, resulting in reduction of the threshold current.

In the fifth embodiment, as in the first embodiment, the p-side guiding layer, the active layer, and the n-side guiding layer are made to be undoped or substantially undoped by performing no intentional doping on these layers. Further, the sum of the thicknesses of the p-side guiding layer, the active layer, and the n-side guiding layer is at least 0.5 times the lasing wavelength. That is, the thickness indicated by Dudp in FIG. 29 is equal to or larger than 0.5 times the lasing wavelength. As a result, most of the laser light exists within these layers, and the free carrier absorption in the cladding layers is reduced.

These features enable the semiconductor laser device to have a high electrical-to-optical power conversion efficiency. In the fifth embodiment, description is made about an 810 nm semiconductor laser device. It is to be understood, however, that the feature of the fifth embodiment may be applied to other semiconductor lasers made of other materials or other wavelength semiconductor lasers.

In the above-described embodiments, proton implantation or the formation of insulating film stripes is used to confine the current and thereby enhance the lasing efficiency. It is to be understood, however, that in other embodiments other current confining methods may be used. It is obvious that the current can also be confined by forming a waveguide (e.g., a ridge waveguide) or by forming a buried current blocking layer such as a buried n-GaAs semiconductor layer while still retaining the advantages of the present invention. It should be further noted that the thicknesses and compositions of the layers in the embodiments given above are by way of example only. The present invention is not limited to these particular thicknesses and compositions unless explicitly so stated.

The features and advantages of the present invention may be summarized as follows:

According to the first aspect of the present invention, the p-side guiding layer, the active layer, and the n-side guiding layer are undoped or substantially undoped; no intentional doping is performed on these layers. Further, the sum of the thicknesses of the p-side guiding layer, the active layer, and the n-side guiding layer is not less than 0.5 times the lasing wavelength of the semiconductor laser device and is not more than 2 μm. As a result, most of the laser light exists within these layers, and the free carrier absorption in the cladding layers is reduced. Further, the active layer is located closer to the p-type cladding layer than to the n-type cladding layer and that the n-side guiding layer has a higher refractive index than the p-side guiding layer. This reduces the light absorption in the guiding layers while avoiding a reduction in the optical confinement factor to the active layer, thereby allowing the semiconductor laser device to have a high electrical-to-optical power conversion efficiency.

According to the second aspect of the present invention, the p-side guiding layer, the active layer, and the n-side guiding layer are undoped or substantially undoped; no intentional doping is performed on these layers. Further, the sum of the thicknesses of the p-side guiding layer, the active layer, and the n-side guiding layer is not less than 0.5 times the lasing wavelength of the semiconductor laser device and is not more than 2 μm. As a result, most of the laser light exists within these layers, and the free carrier absorption in the cladding layers is reduced. Further, the active layer is located closer to the p-type cladding layer than to the n-type cladding layer and that the p-type cladding layer has a lower refractive index than the n-type cladding layer. This reduces the light absorption in the guiding layers while avoiding a reduction in the optical confinement factor to the active layer, thereby allowing the semiconductor laser device to have a high electrical-to-optical power conversion efficiency.

According to the third aspect of the present invention, the p-side guiding layer, the active layer, and the n-side guiding layer are undoped or substantially undoped; no intentional doping is performed on these layers. Further, the sum of the thicknesses of the p-side guiding layer, the active layer, and the n-side guiding layer is not less than 0.5 times the lasing wavelength of the semiconductor laser device and is not more than 2 μm. As a result, most of the laser light exists within these layers, and the free carrier absorption in the cladding layers is reduced. Further, the active layer is located closer to the p-type cladding layer than to the n-type cladding layer, that the n-side guiding layer has a higher refractive index than the p-side guiding layer, and that the p-type cladding layer has a lower refractive index than the n-type cladding layer. This reduces the light absorption in the guiding layers while avoiding a reduction in the optical confinement factor to the active layer, thereby allowing the semiconductor laser device to have a high electrical-to-optical power conversion efficiency.

According to the fourth aspect of the present invention, the p-side guiding layer, the active layer, and the n-side guiding layer are made to be undoped or substantially undoped by performing no intentional doping on these layers. Further, the sum of the thicknesses of the p-side guiding layer, the active layer, and the n-side guiding layer is not less than 0.5 times the lasing wavelength of the semiconductor laser device and is not more than 2 μm. As a result, most of the laser light exists within these layers, and the free carrier absorption in the cladding layers is reduced. Further, the active layer is located closer to the p-type cladding layer than to the n-type cladding layer, and the n-side guiding layer has an inside portion having a higher refractive index than the outside of the inside portion. This reduces the light absorption in the guiding layers while avoiding a reduction in the optical confinement factor to the active layer. Further, since the inside portion of the n-side guiding layer has the higher refractive index than the outside of the inside portion, the outside of the inside portion has a greater band gap energy than the inside portion. This makes it possible to effectively confine carriers (electrons or holes) in the active layer, thereby allowing the semiconductor laser device to have a high electrical-to-optical power conversion efficiency.

According to the fifth aspect of the present invention, the p-side guiding layer, the active layer, and the n-side guiding layer are made to be undoped or substantially undoped by performing no intentional doping on these layers. Further, the sum of the thicknesses of the p-side guiding layer, the active layer, and the n-side guiding layer is not less than 0.5 times the lasing wavelength of the semiconductor laser device and is not more than 2 μm. As a result, most of the laser light exists within these layers, and the free carrier absorption in the cladding layers is reduced. Further, the active layer is located closer to the p-type cladding layer than to the n-type cladding layer and the n-side guiding layer has an inside portion having a higher refractive index than the outside of the inside portion. In addition, the p-type cladding layer has a lower refractive index than the n-type cladding layer. This reduces the light absorption in the guiding layers while avoiding a reduction in the optical confinement factor to the active layer. Further, since the inside portion of the n-side guiding layer has the higher refractive index than the outside of the inside portion, the outside of the inside portion has a greater band gap energy than the inside portion. This makes it possible to effectively confine carriers (electrons or holes) in the active layer, thereby allowing the semiconductor laser device to have a high electrical-to-optical power conversion efficiency.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-275846, filed on Oct. 27, 2008 and a Japanese Patent Application No. 2009-90934, filed on Apr. 3, 2009 including specification, claims, drawings and summary, on which the Convention priority of the present application is based, are incorporated herein by reference in its entirety.

What is claimed is:

1. A semiconductor laser device comprising:
an n-type cladding layer;
a p-type cladding layer;
an active layer located between said n-type cladding layer and said p-type cladding layer;
an n-side guiding layer located on the same side of said active layer as said n-type cladding layer; and
a p-side guiding layer located on the same side of said active layer as said p-type cladding layer, wherein
said n-side guiding layer, said active layer, and said p-side guiding layer are undoped or substantially undoped,
the sum of the thicknesses of said n-side guiding layer, said active layer, and said p-side guiding layer is not less than 0.5 times the lasing wavelength of said semiconductor laser device and is not more than 2 μm, and
said p-side guiding layer is thinner than and has a lower refractive index than said n-side guiding layer.

2. A semiconductor laser device comprising:
an n-type cladding layer;
a p-type cladding layer;
an active layer located between said n-type cladding layer and said p-type cladding layer;
an n-side guiding layer located on the same side of said active layer as said n-type cladding layer; and
a p-side guiding layer located on the same side of said active layer as said p-type cladding layer, wherein
said n-side guiding layer, said active layer, and said p-side guiding layer are undoped or substantially undoped,
the sum of the thicknesses of said n-side guiding layer, said active layer, and said p-side guiding layer is not less than 0.5 times the lasing wavelength of said semiconductor laser device and is not more than 2 μm, and
said p-side guiding layer is thinner than said n-side guiding layer, and said p-type cladding layer has a lower refractive index than said n-type cladding layer.

3. A semiconductor laser device comprising:
an n-type cladding layer;
a p-type cladding layer;
an active layer located between said n-type cladding layer and said p-type cladding layer;
an n-side guiding layer located on the same side of said active layer as said n-type cladding layer; and
a p-side guiding layer located on the same side of said active layer as said p-type cladding layer, wherein said n-side guiding layer, said active layer, and said p-side guiding layer are undoped or substantially undoped, the sum of the thicknesses of said n-side guiding layer, said active layer, and said p-side guiding layer is not less than 0.5 times the lasing wavelength of said semiconductor laser device and is not more than 2 μm, said p-side guiding layer is thinner and has a lower refractive index than said n-side guiding layer, and said p-type cladding layer has a lower refractive index than said n-type cladding layer.

4. The semiconductor laser device according to claim 1, wherein:

said active layer has a multiquantum well structure including a barrier layer;

said barrier layer is undoped or substantially undoped; and the sum of thicknesses of said n-side guiding layer, said active layer, said p-side guiding layer, and said barrier layer is not less than 0.5 times the lasing wavelength of said semiconductor laser device and is not more than 2 μm.

5. The semiconductor laser device according to claim 4, wherein said undoped or substantially undoped layers are not intentionally doped with impurities during growth or processing.

6. The semiconductor laser device according to claim 1, wherein said undoped or substantially undoped layers are not intentionally doped with impurities during growth or processing.

7. The semiconductor laser device according to claim 2, wherein:

said active layer has a multiquantum well structure including a barrier layer;

said barrier layer is undoped or substantially undoped; and the sum of thicknesses of said n-side guiding layer, said active layer, said p-side guiding layer, and said barrier layer is not less than 0.5 times the lasing wavelength of said semiconductor laser device and is not more than 2 μm.

8. The semiconductor laser device according to claim 7, wherein said undoped or substantially undoped layers are not intentionally doped with impurities during growth or processing.

9. The semiconductor laser device according to claim 2, wherein said undoped or substantially undoped layers are not intentionally doped with impurities during growth or processing.

10. The semiconductor laser device according to claim 3, wherein:

said active layer has a multiquantum well structure including a barrier layer;

said barrier layer is undoped or substantially undoped; and the sum of thicknesses of said n-side guiding layer, said active layer, said p-side guiding layer, and said barrier layer is not less than 0.5 times the lasing wavelength of said semiconductor laser device and is not more than 2 μm.

11. The semiconductor laser device according to claim 10, wherein said undoped or substantially undoped layers are not intentionally doped with impurities during growth or processing.

12. The semiconductor laser device according to claim 3, wherein said undoped or substantially undoped layers are not intentionally doped with impurities during growth or processing.

13. A semiconductor laser device comprising:

an n-type cladding layer;

a p-type cladding layer;

an active layer located between said n-type cladding layer and said p-type cladding layer;

an n-side guiding layer located on the same side of said active layer as said n-type cladding layer; and a p-side guiding layer located on the same side of said active layer as said p-type cladding layer, wherein said n-side guiding layer, said active layer, and said p-side guiding layer are undoped or substantially undoped, the sum of the thicknesses of said n-side guiding layer, said active layer, and said p-side guiding layer is not less than 0.5 times the lasing wavelength of said semiconductor laser device and is not more than 2 μm, said p-side guiding layer is thinner than said n-side guiding layer, and said n-side guiding layer includes a first layer located on a side of said active layer, a second layer located on a side of said n-type cladding layer, and a third layer disposed between the first layer and the second layer, the third layer having a higher refractive index than the first layer and the second layer.

14. A semiconductor laser device comprising:

an n-type cladding layer;

a p-type cladding layer;

an active layer located between said n-type cladding layer and said p-type cladding layer;

an n-side guiding layer located on the same side of said active layer as said n-type cladding layer; and a p-side guiding layer located on the same side of said active layer as said p-type cladding layer, wherein said n-side guiding layer, said active layer, and said p-side guiding layer are undoped or substantially undoped, the sum of the thicknesses of said n-side guiding layer, said active layer, and said p-side guiding layer is not less than 0.5 times the lasing wavelength of said semiconductor laser device and is not more than 2 μm, said p-side guiding layer is thinner than said n-side guiding layer, said p-type cladding layer has a lower refractive index than said n-type cladding layer, and said n-side guiding layer includes a first layer located on a side of said active layer, a second layer located on a side of said n-type cladding layer, and a third layer disposed between the first layer and the second layer, the third layer having a higher refractive index than the first layer and the second layer.

\* \* \* \* \*